United States Patent
Chin et al.

(10) Patent No.: US 9,224,494 B2
(45) Date of Patent: Dec. 29, 2015

(54) ERASE SPEED ADJUSTMENT FOR ENDURANCE OF NON-VOLATILE STORAGE

(71) Applicant: SanDisk Technologies Inc., Plano, TX (US)

(72) Inventors: Henry Chin, Fremont, CA (US); Dana Lee, Saratoga, CA (US)

(73) Assignee: SanDisk Technologies Inc., Plano, TX (US)

( * ) Notice: Subject to any disclaimer, the term of this patent is extended or adjusted under 35 U.S.C. 154(b) by 92 days.

(21) Appl. No.: 14/152,834

(22) Filed: Jan. 10, 2014

(65) Prior Publication Data
US 2015/0200019 A1    Jul. 16, 2015

(51) Int. Cl.
| G11C 11/34 | (2006.01) |
|---|---|
| G11C 16/34 | (2006.01) |
| G11C 16/04 | (2006.01) |
| G11C 13/00 | (2006.01) |
| G11C 16/14 | (2006.01) |
| G11C 16/00 | (2006.01) |
| G11C 16/16 | (2006.01) |

(52) U.S. Cl.
CPC ........ *G11C 16/3454* (2013.01); *G11C 16/0483* (2013.01); *G11C 13/0097* (2013.01); *G11C 16/00* (2013.01); *G11C 16/14* (2013.01); *G11C 16/16* (2013.01)

(58) Field of Classification Search
CPC .... G11C 16/14; G11C 13/0097; G11C 16/16; G11C 16/00; G06F 12/0246
USPC ............ 365/185.03, 185.18, 185.19, 185.22, 365/185.29, 185.3
See application file for complete search history.

(56) References Cited

U.S. PATENT DOCUMENTS

| 6,643,181 | B2 | 11/2003 | Sofer et al. |
|---|---|---|---|
| 7,457,166 | B2 | 11/2008 | Hemink et al. |
| 7,522,457 | B2 | 4/2009 | Hemink et al. |
| 7,630,255 | B2 | 12/2009 | Yang |
| 8,036,044 | B2 | 10/2011 | Dong et al. |
| 8,130,551 | B2 | 3/2012 | Oowada et al. |
| 8,339,866 | B2 | 12/2012 | Imamoto et al. |
| 8,976,597 | B2 * | 3/2015 | Shiino et al. ............. 365/185.19 |
| 9,070,474 | B2 * | 6/2015 | Izumi |
| 9,082,510 | B2 * | 7/2015 | He et al. |
| 2008/0089135 | A1 | 4/2008 | Ito |
| 2008/0101126 | A1 | 5/2008 | Hemink et al. |

* cited by examiner

*Primary Examiner* — Fernando Hidalgo
(74) *Attorney, Agent, or Firm* — Vierra Magen Marcus LLP

(57) ABSTRACT

Techniques are disclosed herein for erasing non-volatile storage. The erase has two or more phases. The first phase includes erasing a group of non-volatile storage elements at a first speed until the group of non-volatile storage elements pass a first verify level. The second phase is performed after the group of non-volatile storage elements pass the first verify level. The second phase includes erasing the group of non-volatile storage elements at a second speed that is less than the first speed until the group of non-volatile storage elements pass a second verify level that is lower than the first verify level. Erasing at the first speed results in a fast erase without significant risk of over-erasing the storage elements. Erasing at the second speed during the second phase prevents or reduces over-erasure which could damage the storage elements.

19 Claims, 17 Drawing Sheets

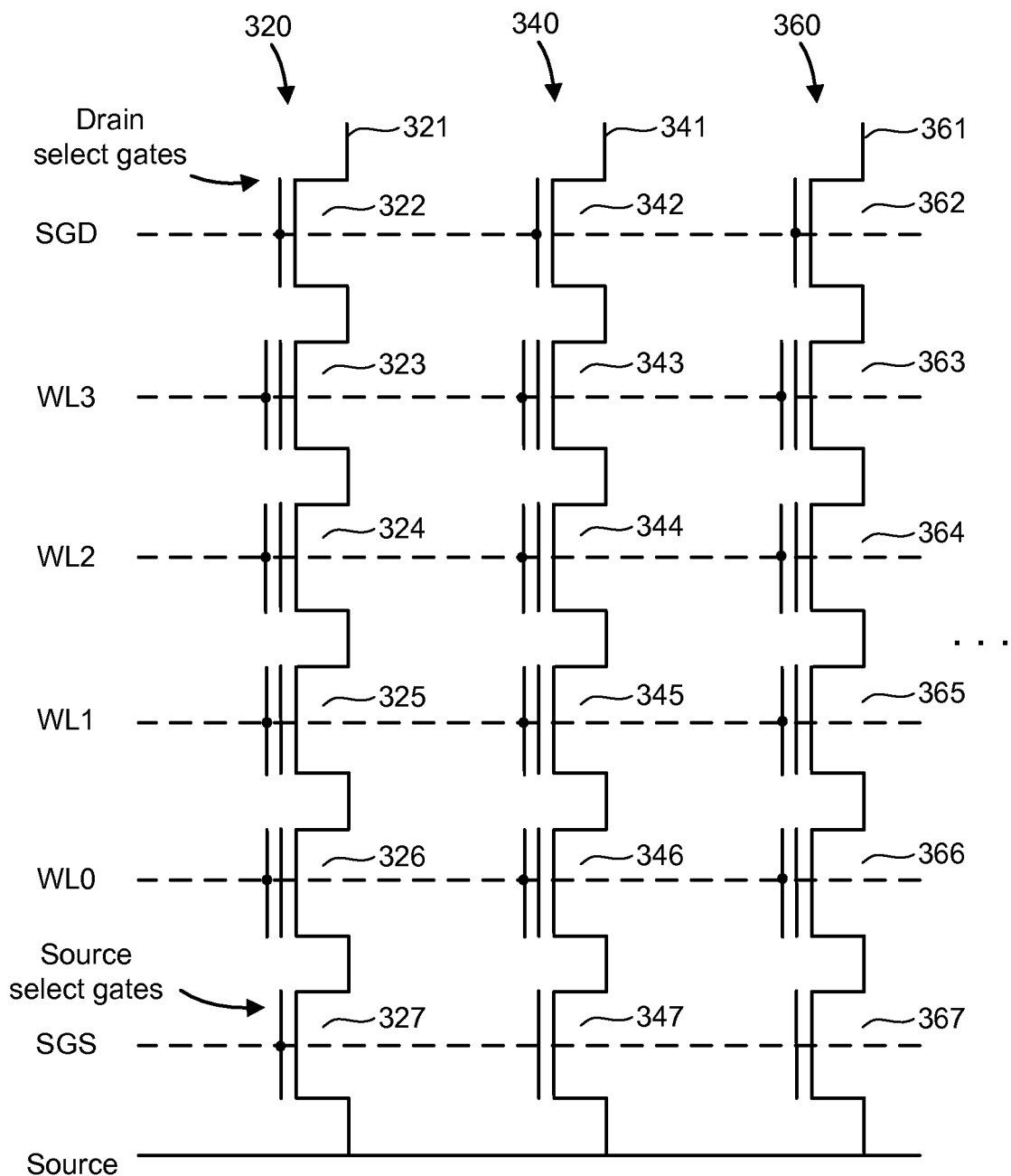

Fig. 8
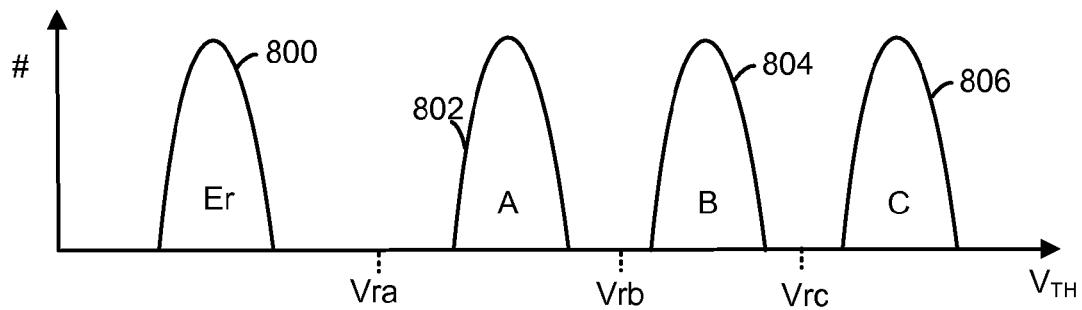
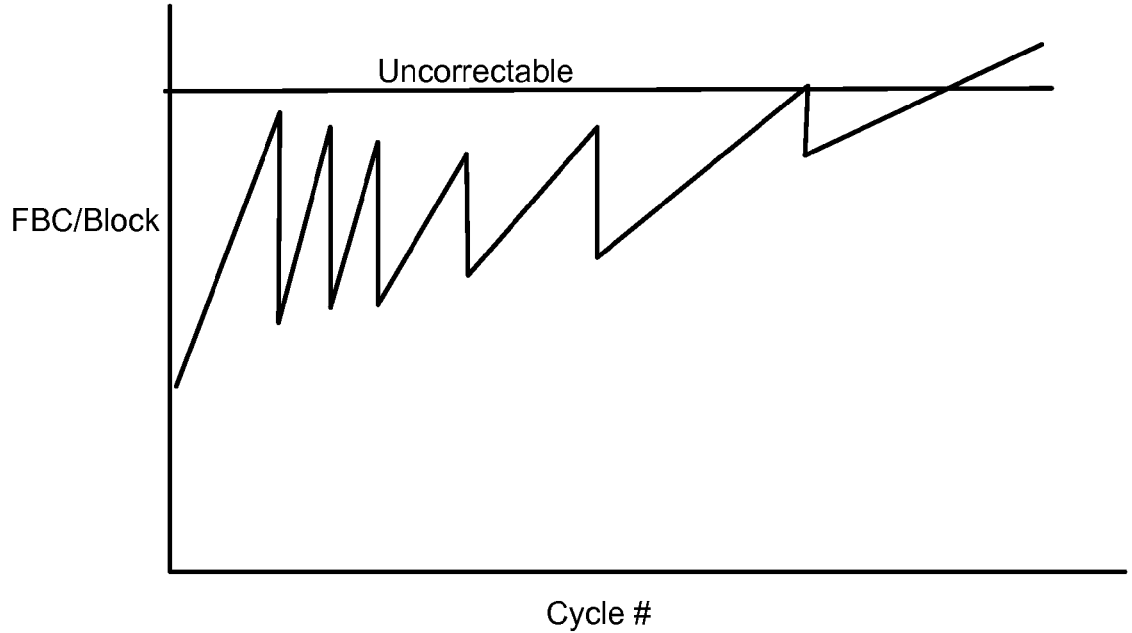
FIG. 11
(conventional art)

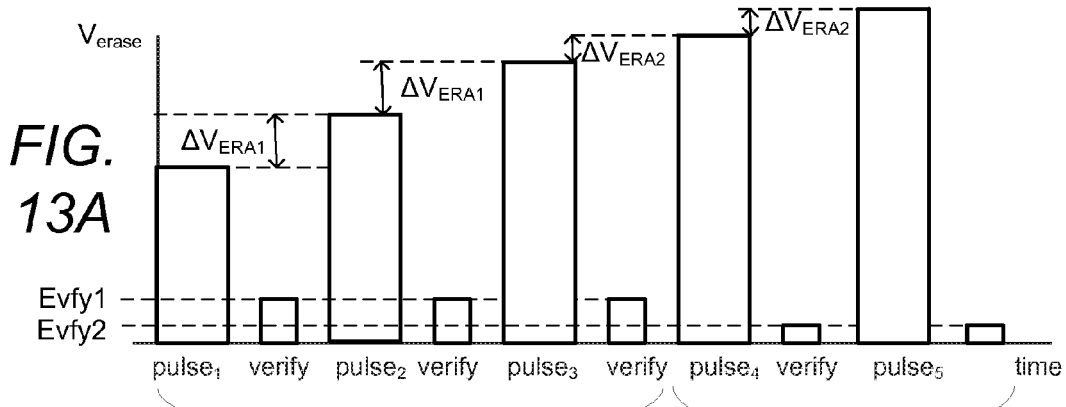
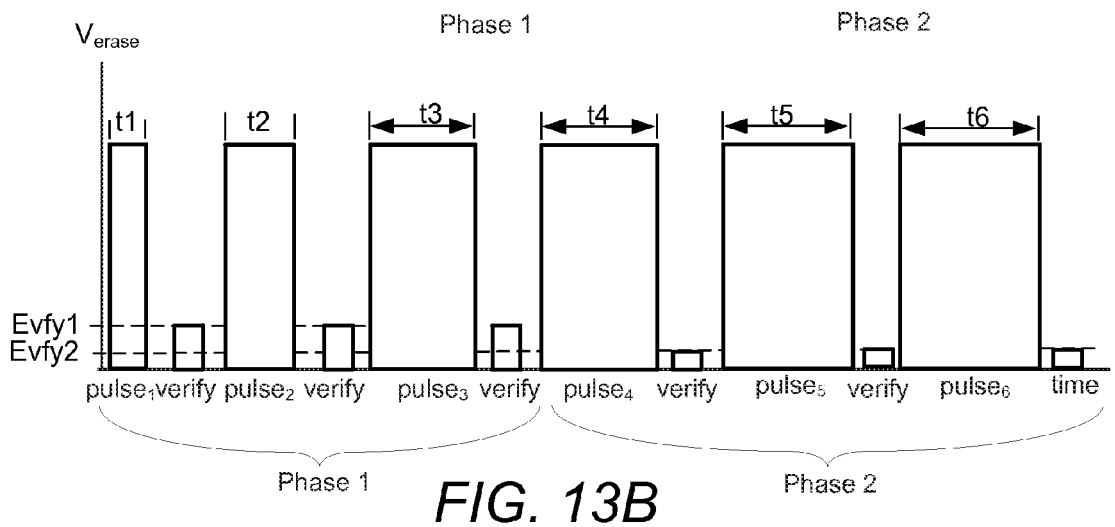
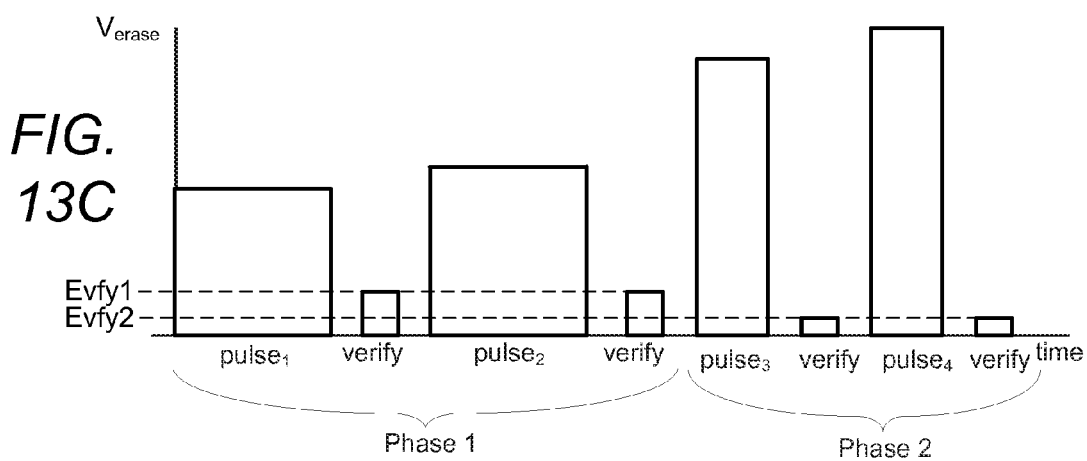

ERASE SPEED ADJUSTMENT FOR ENDURANCE OF NON-VOLATILE STORAGE

BACKGROUND

The present disclosure relates to technology for non-volatile storage.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state.

Erasing the memory cells can be achieved by removing the electrons from the floating gate, thereby lowering the threshold voltage. In one approach, a large voltage is applied to a substrate in which the memory cells reside while grounding the control gate. The erase operation may subject the memory cells to stress.

One issue which continues to be problematic is memory device endurance. In particular, it is desirable to increase the number of erase/program cycles. At the same time, it is desirable to efficiently erase the memory cells.

BRIEF DESCRIPTION OF THE DRAWINGS

FIG. 3 is a block diagram of an array of NAND flash storage elements.

FIG. 8 depicts an example set of Vt distributions.

FIG. 11 is a diagram that illustrates fail bit count (FBC) versus erase cycles for a conventional memory device.

FIG. 13A-13E show several different embodiments of erase signals for altering the speed of erase.

DETAILED DESCRIPTION

Techniques are disclosed herein for erasing non-volatile storage. The erase has two phases in one embodiment. The first phase includes erasing a group of non-volatile storage elements at a first speed until the group of non-volatile storage elements pass a first verify level. The second phase is performed after the group of non-volatile storage elements pass the first verify level. The second phase includes erasing the group of non-volatile storage elements at a second speed that is less than the first speed until the group of non-volatile storage elements pass a second verify level that is lower than the first verify level. The "speed of the erase," as this or similar phrases are used herein, refers to the amount by which the threshold voltage distribution is moved per loop. In other words, erase speed refers to the movement in $V_{TH}$ distribution between verify operations. A faster erase speed, as the term is used herein, refers to more movement of the $V_{TH}$ distribution. Note that moving the threshold voltage distribution by a greater amount may allow for fewer erase loops, which can reduce the time it takes to erase the memory cells.

Erasing at the first speed during the first phase results in a fast erase without over-erasing the storage elements, though in general the storage elements are not yet sufficiently erased. Erasing at the second speed during the second phase prevents or reduces over-erasure which could damage the storage elements. Since the second speed is slower, the threshold distribution is moved by a smaller amount compared to the first erase speed. This helps to prevent over-erasure.

Techniques described herein can be applied to 2D NAND, 3D NAND, or memory devices other than NAND, such as, but not limited to, NOR.

Figure 1:
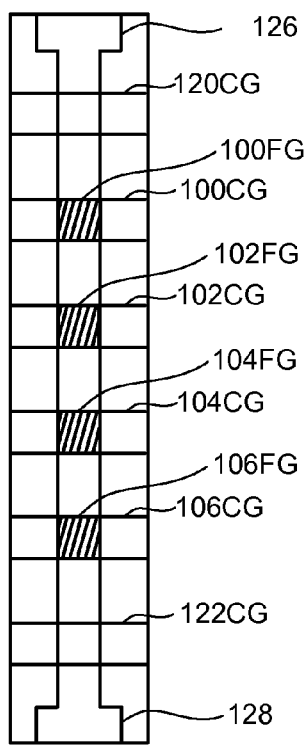
FIG. 1 is a top view of a NAND string.
Figure 2:
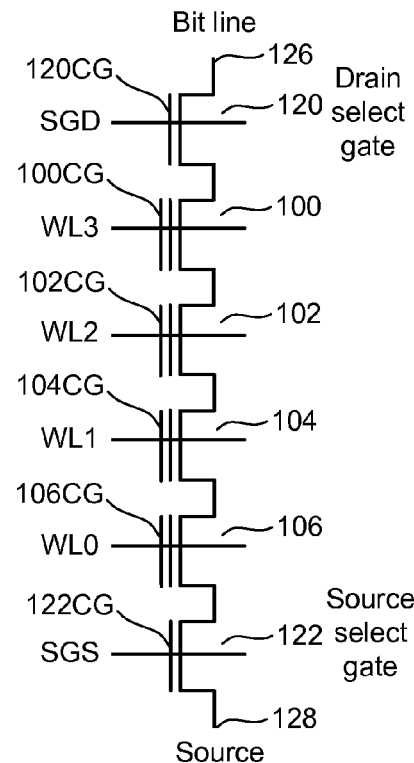
FIG. 2 is an equivalent circuit diagram of the NAND string of FIG. 1.

One example of a memory system suitable for implementing embodiments of the present invention uses the NAND flash memory structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. The control gates can also be provided as portions of the word lines. In one embodiment, transistors 100, 102, 104 and 106 are each storage elements, also referred to as memory cells. In other embodiments, the storage elements may include multiple transistors or may be different than that depicted in FIGS. 1 and 2. Select gate 120 is connected to select line SGD (drain select gate). Select gate 122 is connected to select line SGS (source select gate).

FIG. 3 is a circuit diagram depicting three NAND strings. A typical architecture for a flash memory system using a NAND structure will include many NAND strings. For example, three NAND strings 320, 340 and 360 are shown in a memory array having many more NAND strings. Each of the example NAND strings includes two select gates and four storage elements. While four storage elements are illustrated for simplicity, modern NAND strings can have thirty-two, sixty-four storage elements, or some other number of storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, etc. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements. For example, U.S. Pat. No. 6,222,762 and U.S. Pat. No. 7,237,074, both of which are incorporated herein by reference in their entirety, describe various data encoding schemes for multi-state flash storage elements.

When programming a flash storage element, a program voltage is applied to the control gate of the storage element and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 3, the program voltage will also be applied to the control gates of storage elements 344 and 364.

Figure 4:
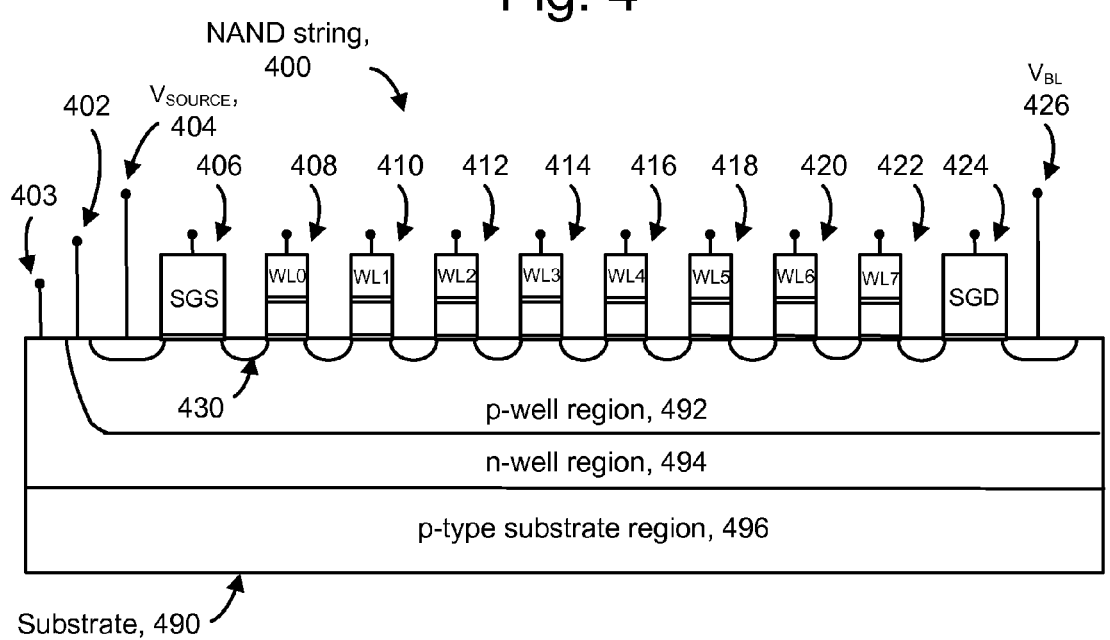
FIG. 4 depicts a cross-sectional view of a NAND string formed on a substrate.

FIG. 4 depicts a cross-sectional view of an NAND string formed on a substrate. The view is simplified and not to scale. The NAND string 400 includes a source-side select gate 406, a drain-side select gate 424, and eight storage elements 408, 410, 412, 414, 416, 418, 420 and 422, formed on a substrate 490. A number of source/drain regions, one example of which is source drain/region 430, are provided on either side of each storage element and the select gates 406 and 424. In one approach, the substrate 490 employs a triple-well technology which includes a p-well region 492 within an n-well region 494, which in turn is within a p-type substrate region 496. The NAND string and its non-volatile storage elements can be formed, at least in part, on the p-well region. A source supply line 404 with a potential of $V_{SOURCE}$ is provided in addition to a bit line 426 with a potential of $V_{BL}$. In one possible approach, a voltage can be applied to the p-well region 492 via a terminal 402. A voltage can also be applied to the n-well region 494 via a terminal 403.

During a read or verify operation, including an erase-verify operation, in which the condition of a storage element, such as its threshold voltage, is ascertained, $V_{CGR}$ is provided on a selected word line which is associated with a selected storage element. Further, recall that the control gate of a storage element may be provided as a portion of the word line. For example, WL0, WL1, WL2, WL3, WL4, WL5, WL6 and WL7 can extend via the control gates of storage elements 408, 410, 412, 414, 416, 418, 420 and 422, respectively. A read pass voltage, $V_{READ}$, can be applied to unselected word lines associated with NAND string 400, in one possible boosting scheme. Other boosting schemes apply $V_{READ}$ to some word lines and lower voltages to other word lines. $V_{SGS}$ and $V_{SGD}$ are applied to the select gates 406 and 424, respectively.

Figure 5:
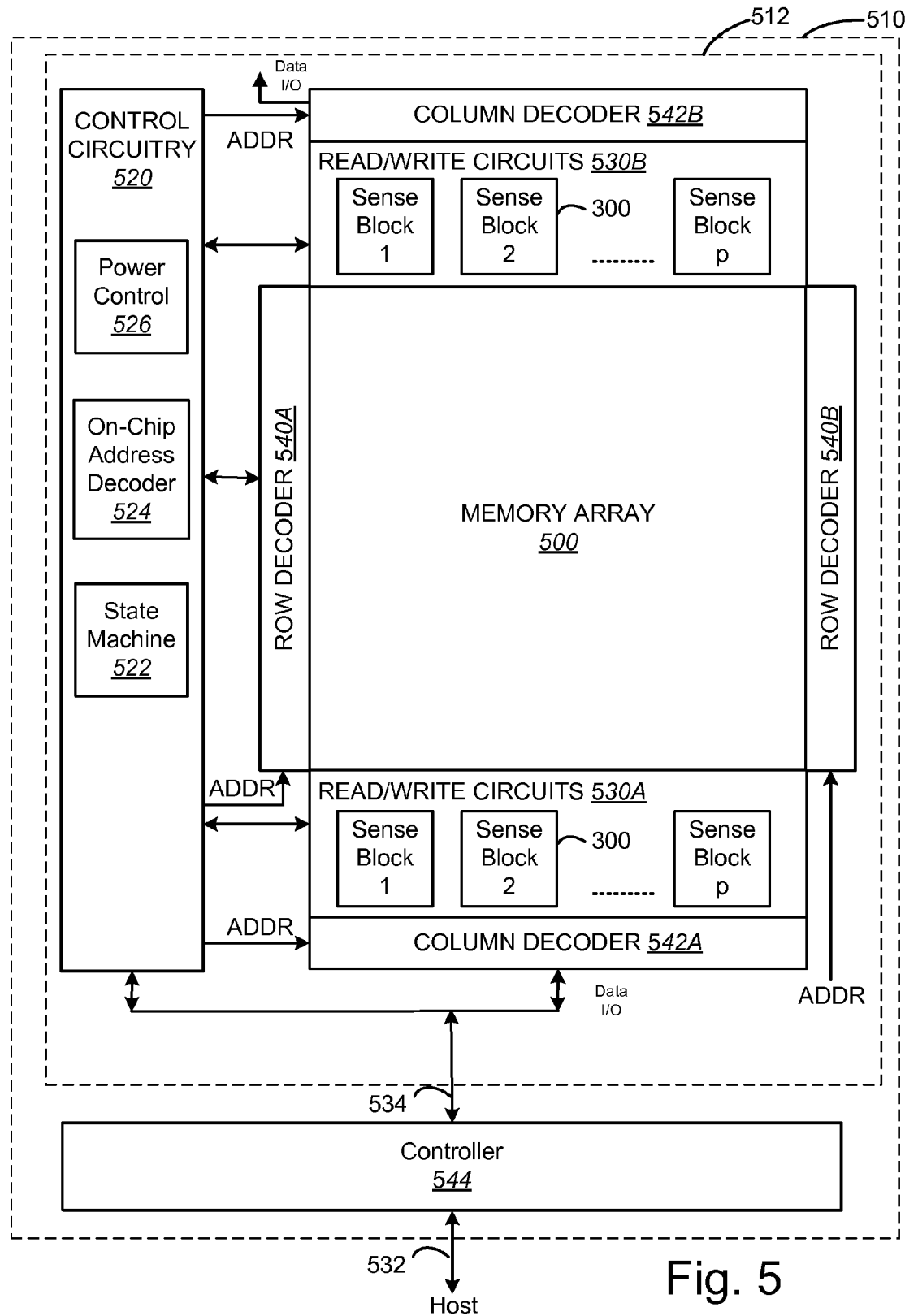
FIG. 5 illustrates a non-volatile storage device that may include one or more memory die or chips.

FIG. 5 illustrates a non-volatile storage device 510 that may include one or more memory die or chips 512. Memory die 512 includes an array (two-dimensional or three dimensional) of memory cells 500, control circuitry 520, and read/write circuits 530A and 530B. In one embodiment, access to the memory array 500 by the various peripheral circuits is implemented in a symmetric fashion, on opposite sides of the array, so that the densities of access lines and circuitry on each side are reduced by half. The read/write circuits 530A and 530B include multiple sense blocks 300 which allow a page of memory cells to be read or programmed in parallel. The memory array 500 is addressable by word lines via row decoders 540A and 540B and by bit lines via column decoders 542A and 542B. In a typical embodiment, a controller 544 is included in the same memory device 510 (e.g., a removable storage card or package) as the one or more memory die 512. Commands and data are transferred between the host and controller 544 via lines 532 and between the controller and the one or more memory die 512 via lines 534. One implementation can include multiple chips 512.

Control circuitry 520 cooperates with the read/write circuits 530A and 530B to perform memory operations on the memory array 500. The control circuitry 520 includes a state machine 522, an on-chip address decoder 524 and a power control module 526. The state machine 522 provides chip-level control of memory operations. The on-chip address decoder 524 provides an address interface to convert between the address that is used by the host or a memory controller to the hardware address used by the decoders 540A, 540B, 542A, and 542B. The power control module 526 controls the power and voltages supplied to the word lines and bit lines during memory operations. In one embodiment, power control module 526 includes one or more charge pumps that can create voltages larger than the supply voltage.

In one embodiment, one or any combination of control circuitry 520, power control circuit 526, decoder circuit 524, state machine circuit 522, decoder circuit 542A, decoder circuit 542B, decoder circuit 540A, decoder circuit 540B, read/write circuits 530A, read/write circuits 530B, and/or controller 544 can be referred to as one or more managing circuits.

Figure 6A:
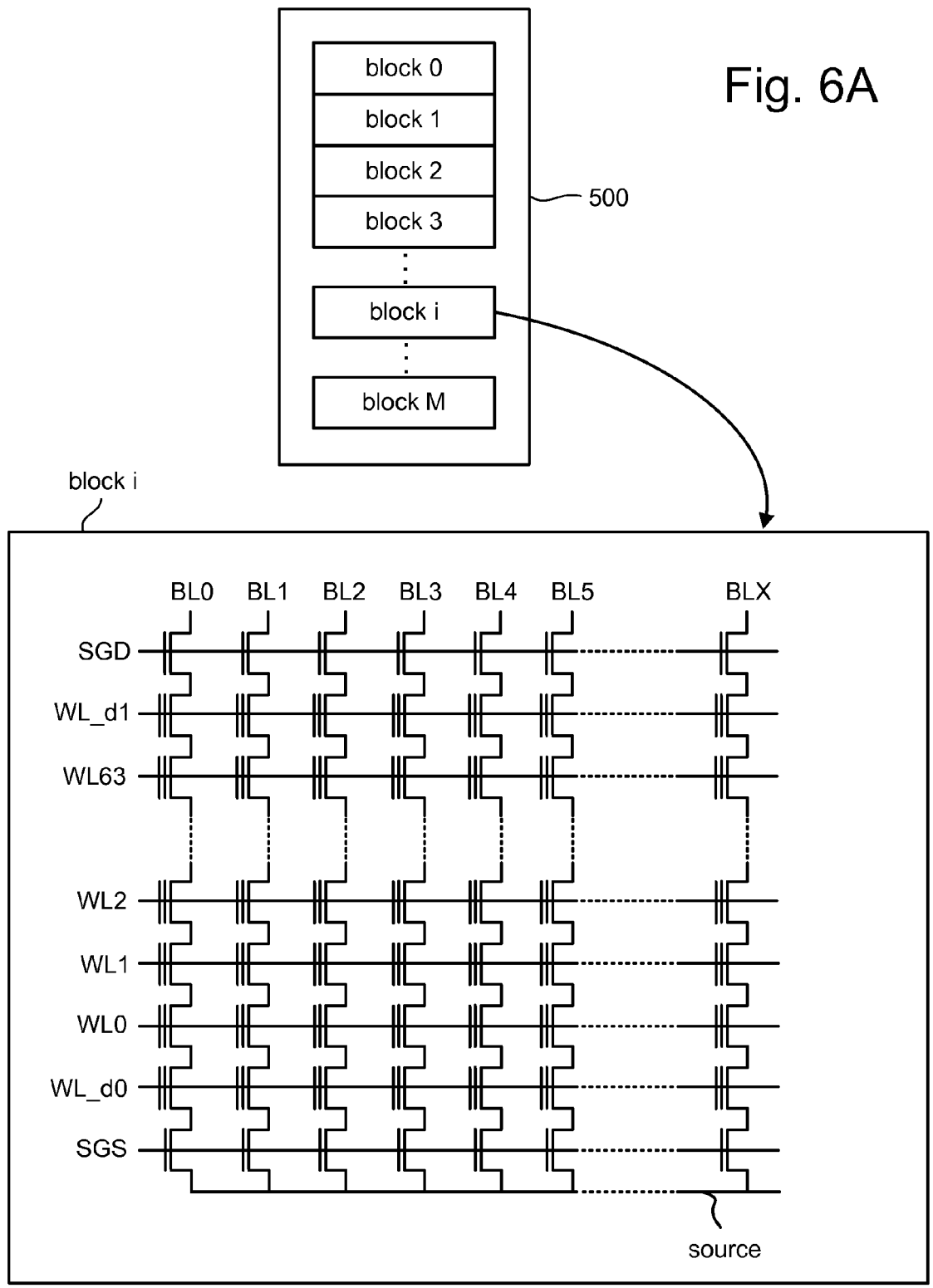
FIG. 6A depicts an exemplary structure of memory cell array.

FIG. 6A depicts an exemplary structure of memory cell array 500. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes parity bits of an Error Correction Code (ECC) that have been calculated from the user data of the sector. A portion of the controller (described below) calculates the ECC parity when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 6A also shows more details of block i of memory array 500. Block i includes X+1 bit lines and X+1 NAND strings. Block i also includes 64 data word lines (WL0-WL63), two dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or fewer than 64 data memory cells and more or fewer dummy memory cells. Data memory cells can store user or system data. Dummy memory cells are typically not used to store user or system data. Some embodiments do not include dummy memory cells.

Figure 6B:
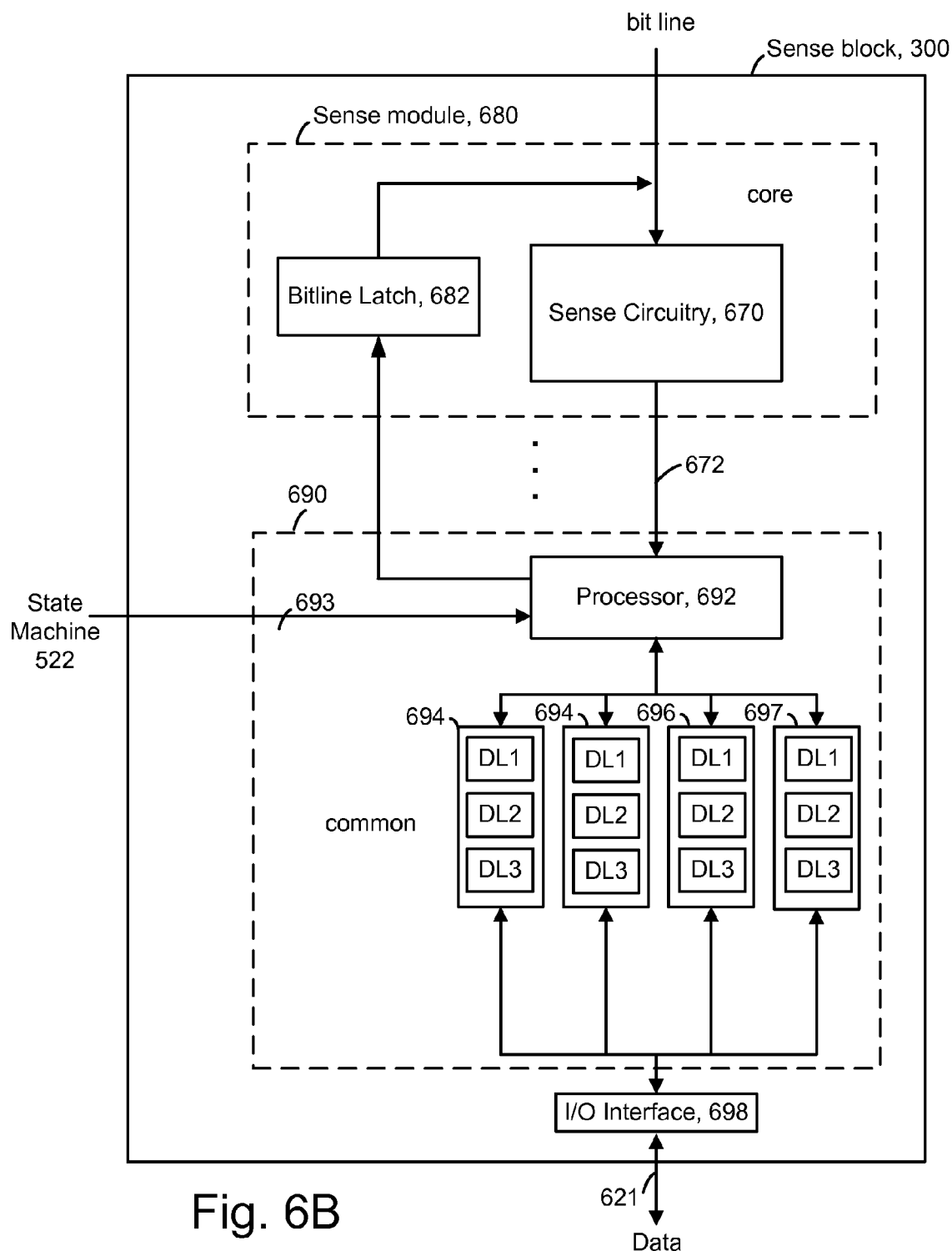
FIG. 6B is a block diagram depicting one embodiment of a sense block.

FIG. 6B is a block diagram depicting one embodiment of a sense block 300. An individual sense block 300 is partitioned into a core portion, referred to as a sense module 680, and a common portion 690. In one embodiment, there is a separate sense module 680 for each bit line and one common portion 690 for a set of multiple sense modules 680. In one example, a sense block 300 will include one common portion 690 and eight sense modules 680. Each of the sense modules in a group will communicate with the associated common portion via a data bus 672.

Sense module 680 comprises sense circuitry 670 that determines whether a conduction current in a connected bit line is above or below a predetermined threshold level. Sense module 680 also includes a bit line latch 682 that is used to set a voltage condition on the connected bit line. For example, a predetermined state latched in bit line latch 682 will result in the connected bit line being pulled to a state designating program inhibit (e.g., 1.5-3 V). As an example, a flag=0 can inhibit programming, while flag=1 does not inhibit programming.

Common portion 690 comprises a processor 692, three example sets of data latches 694 and an I/O Interface 698 coupled between the sets of data latches 694 and data bus 621. One set of data latches can be provided for each sense module, and three data latches identified by DL1, DL2, and DL3 may be provided for each set. The use of the data latches is further discussed below.

Processor 692 performs computations. For example, one of its functions is to determine the data stored in the sensed storage element and store the determined data in the set of data latches. At least some of the data latches in a set of data latches (e.g., 694) are used to store data bits determined by processor 692 during a read operation. At least some of the data latches in a set of data latches are also used to store data bits imported from the data bus 621 during a program operation. The imported data bits represent write data meant to be programmed into the memory. I/O interface 698 provides an interface between data latches 694-697 and the data bus 621.

In one embodiment, data is stored in the DL1 and DL2 latches at the beginning of the program operation. For example, lower page data may be stored in DL1 and upper page data may be stored in DL2. In one embodiment, lower page data that is read from memory cells during an IDL is stored in the DL1 latches. DL3 may be used to store verify status, such as lockout status during programming. For example, when a memory cell's Vt has been verified a reaching its target level, the DL3 latch can be set to indicate this such that further programming of the memory cell may be inhibited. Note this describes programming two bits per memory cell. In one embodiment, during a read operation, the DL1 and DL2 latches are used to store the two bits that are read from the memory cell. Note that there may be more than two bits per memory cell. There can be one additional latch for each additional bit to be stored per memory cell.

During reading or other sensing, the state machine 622 controls the supply of different control gate voltages to the addressed storage element. As it steps through the various control gate voltages corresponding to the various memory states supported by the memory, the sense module 680 may trip at one of these voltages and an output will be provided from sense module 680 to processor 692 via bus 672. At that point, processor 692 determines the resultant memory state by consideration of the tripping event(s) of the sense module and the information about the applied control gate voltage from the state machine via input lines 693. It then computes a binary encoding for the memory state and stores the resultant data bits into data latches (e.g., 694). In another embodiment of the core portion, bit line latch 682 serves both as a latch for latching the output of the sense module 680 and as a bit line latch as described above.

Some implementations can include multiple processors 692. In one embodiment, each processor 692 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 692 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 694-697 from the data bus 621. The program operation, under the control of the state machine, comprises a series of programming voltage pulses applied to the control gates of the addressed storage elements. Each program pulse is followed by a read back (verify) to determine if the storage element has been programmed to the desired memory state. Processor 692 monitors the read back memory state relative to the desired memory state. When the two are in agreement, the processor 692 sets the bit line latch 682 so as to cause the bit line to be pulled to a state designating program inhibit. This inhibits the storage element coupled to the bit line from further programming even if program pulses appear on its control gate. In other embodiments, the processor initially loads the bit line latch 682 and the sense circuitry sets it to an inhibit value during the verify process.

Each set of data latch stacks 694-697 contains a stack of data latches corresponding to the sense module 680, in one embodiment. In one embodiment, there are three data latches per sense module 680. All the DL1 and DL2 data latches corresponding to the read/write block of m storage elements can be linked together to form a block shift register so that a block of data can be input or output by serial transfer.

In one embodiment, one purpose of the DL1 and DL2 latches is to store data that is to be programmed into a storage element. For example, the storage elements may store two bits per storage element. In one embodiment, lower page data is initially stored into the DL1 latches and upper page data is initially stored into the DL2 latches.

In one embodiment, the storage elements store three bits per storage element. In this case, there may be an additional data latch (not depicted in FIG. 6B) for initially storing the third bit of data that is to be programmed into a storage element. In one embodiment, the storage elements four bits per storage element, in which there may be two additional data latches (not depicted in FIG. 6B) for initially storing the third and fourth bits of data that is to be programmed into a storage element. The storage elements could store more than four bits per storage element, in which case there may be one data latch for each bit.

Additional information about the read operations and sense amplifiers can be found in (1) U.S. Pat. No. 7,196,931, "Non- Volatile Memory And Method With Reduced Source Line Bias Errors,"; (2) U.S. Pat. No. 7,023,736, "Non-Volatile Memory And Method with Improved Sensing,"; (3) U.S. Patent Application Pub. No. 2005/0169082; (4) U.S. Pat. No. 7,196,928, "Compensating for Coupling During Read Operations of Non-Volatile Memory," and (5) United States Patent Application Pub. No. 2006/0158947, "Reference Sense Amplifier For Non-Volatile Memory," published on Jul. 20, 2006. All five of the immediately above-listed patent documents are incorporated herein by reference in their entirety.

Figure 7:
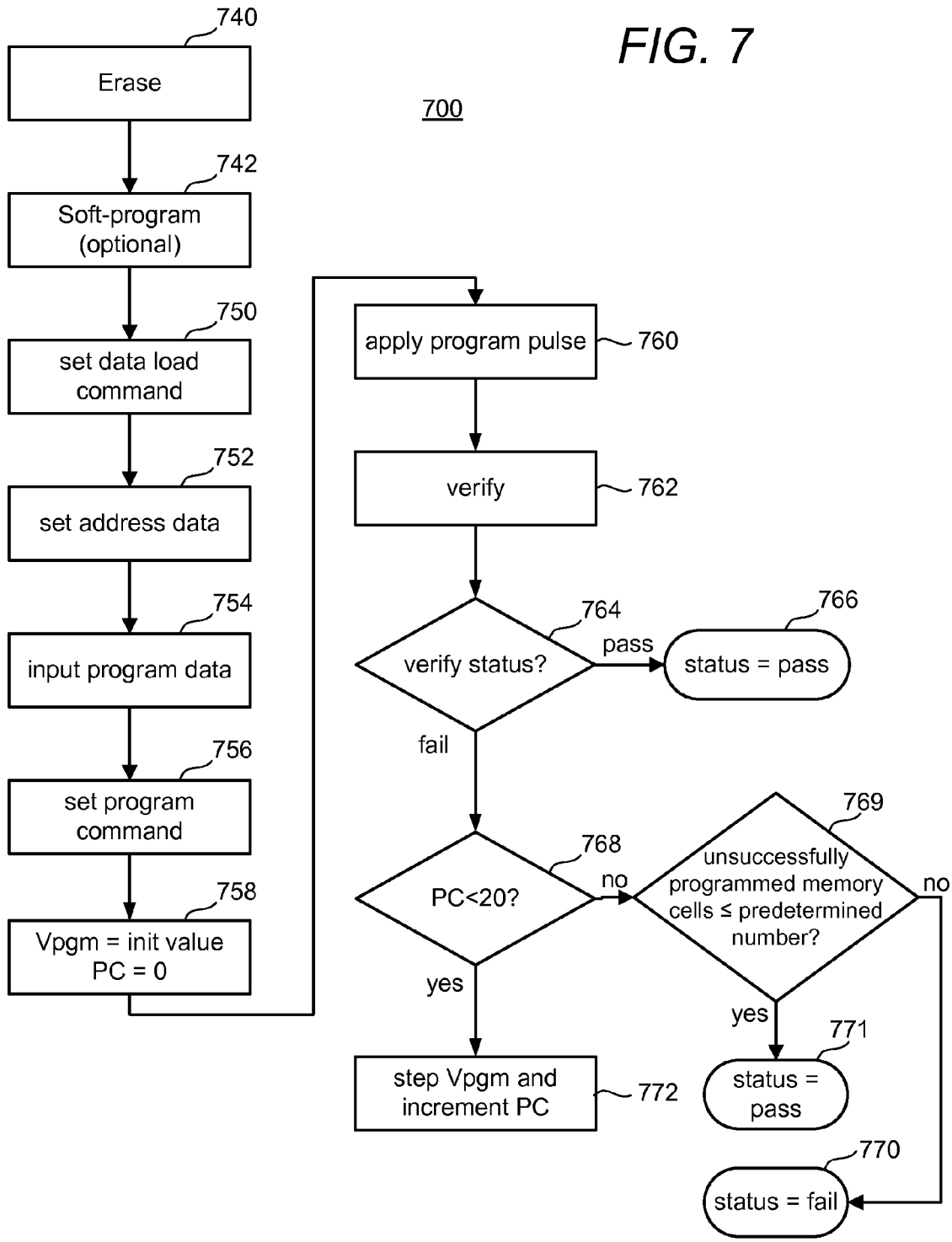
FIG. 7 is a flow chart describing one embodiment of a method for programming non-volatile memory.

FIG. 7 is a flow chart describing one embodiment of a method 700 for programming non-volatile memory. The memory cells to be programmed are erased at step 740. Using embodiments disclosed herein, the memory cells are erased in two or more phases with each phase slower than the previous. Step 740 can include erasing more memory cells than those to be programmed (e.g., in blocks or other units). At optional step 742, soft programming is performed to narrow the distribution of erased threshold voltages for the erased memory cells. Some memory cells may be in a deeper erased state than necessary as a result of the erase process. Soft programming can apply small programming pulses to move the threshold voltage of the erased memory cells closer to the erase verify level. At step 750 of FIG. 7, a "data load" command is issued by controller 544 and input to control circuitry 520, allowing data to be input to a data input/output buffer. At step 752, address data designating the page address is input to row controller or decoder 540 from the controller or host. The input data is recognized as the page address and latched via state machine 522. At step 754, a page of program data for the addressed page is input to data input/output buffer for programming. For example, 532 bytes of data could be input in one embodiment. That data is latched in the appropriate registers for the selected bit lines. In some embodiments, the data is also latched in a second register for the selected bit lines to be used for verify operations. At step 756, a "program" command is issued by the controller and input to data input/output buffer. The command is latched by state machine 316 via the command latch signal input to command circuits.

Triggered by the "program" command, the data latched in step 754 will be programmed into the selected memory cells controlled by state machine 522 using stepped pulses applied to the appropriate word line. At step 758, $V_{PGM}$, the programming pulse voltage level applied to the selected word line, is initialized to the starting pulse (e.g., 12V) and a program counter PC maintained by state machine 522 is initialized at 0. At step 760, the first $V_{PGM}$ pulse is applied to the selected word line. If logic "0" is stored in a particular data latch indicating that the corresponding memory cell should be programmed, then the corresponding bit line is grounded. On the other hand, if logic "1" is stored in the particular latch indicating that the corresponding memory cell should remain in its current data state, then the corresponding bit line is connected to $V_{DD}$ to inhibit programming.

At step 762, the states of the selected memory cells are verified. If it is detected that the target threshold voltage of a selected cell has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine knows that all selected cells have been programmed. At step 764, it is checked whether all of the data latches are storing logic "1." If so, the programming process is complete and successful because all selected memory cells were programmed and verified to their target states. A status of "PASS" is reported at step 766.

If, at step 764, it is determined that not all of the data latches are storing logic "1," then the programming process continues. At step 768, the program counter PC is checked against a program limit value. One example of a program limit value is 20; however, other values can be used in various implementations. If the program counter PC is not less than 20, then it is determined at step 769 whether the number of bits that have not been successfully programmed is equal to or less than a predetermined number. If the number of unsuccessfully programmed bits is equal to or less than the predetermined number, then the programming process is flagged as passed and a status of pass is reported at step 771. The bits that are not successfully programmed can be corrected using error correction during the read process. If however, the number of unsuccessfully programmed bits is greater than the predetermined number, the program process is flagged as failed and a status of fail is reported at step 770. If the program counter PC is less than 20, then the $V_{PGM}$ level is increased by the step size and the program counter PC is incremented at step 772. After step 772, the process loops back to step 760 to apply the next $V_{PGM}$ pulse.

The flowchart of FIG. 7 depicts a single-pass programming method as can be applied for binary storage. In a two-pass programming method as can be applied for multi-level storage, for example, multiple programming or verification steps may be used in a single iteration of the flowchart. Steps 758-772 may be performed for each pass of the programming operation. In a first pass, one or more program pulses may be applied and the results thereof verified to determine if a cell is in the appropriate intermediate state. In a second pass, one or more program pulses may be applied and the results thereof verified to determine if the cell is in the appropriate final state.

At the end of a successful program process, the threshold voltages of the memory cells should be within one or more distributions of threshold voltages for programmed memory cells or within a distribution of threshold voltages for erased memory cells. FIG. 8 illustrates exemplary threshold voltage distributions for a memory cell array when each memory cell stores two bits of data in four physical states. Distribution 800 represents a distribution of threshold voltages of cells that are in an erased state (storing "11"), which may have negative threshold voltage levels. Distribution 802 represents a distribution of threshold voltages of cells that are in a first programmed state, storing "10." Distribution 804 represents a distribution of threshold voltages of cells that are in a second programmed state, storing "00." Distribution 806 represents a distribution of threshold voltages of cells that are in a third programmed state, storing "01."

Of course, if the memory is operated with more than four physical states then there will be a number of threshold voltage distributions within the defined voltage threshold window of the memory cells that is equal to the number of states. Further, although specific bit patterns have been assigned to each of the distributions or physical states, different bit patterns may be assigned.

Figure 9:
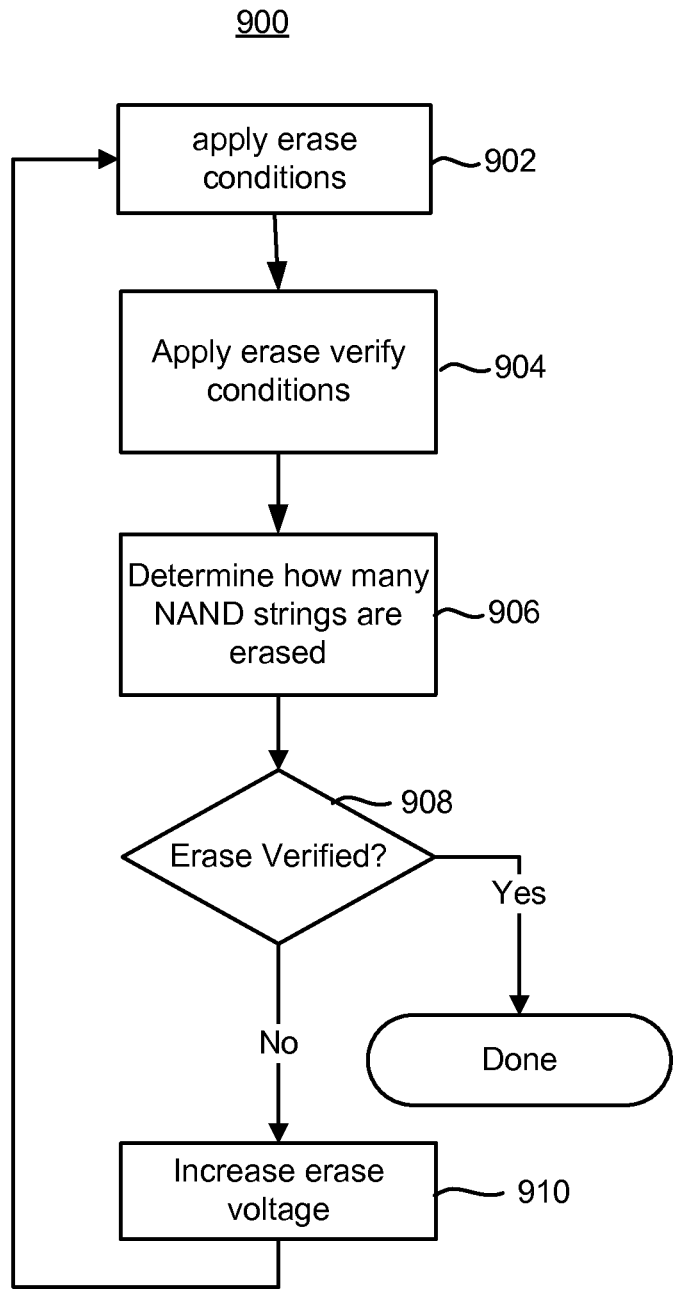
FIG. 9 is a flow chart describing a conventional process for erasing memory cells.

FIG. 9 is a flow chart describing a conventional process 900 for erasing memory cells. In step 902, erase conditions are applied to the memory cells. In one embodiment, the erase is achieved by raising the p-well to an erase voltage for a sufficient period of time and grounding the word lines of a selected block while the source and bit lines are floating. Due to capacitive coupling, the unselected word lines, bit lines, select lines, and the common source line are also raised to a significant fraction of the erase voltage. A strong electric field is thus applied to the tunnel oxide layers of selected memory cells and the data of the selected memory cells are erased as electrons of the floating gates are emitted to the substrate side, typically by Fowler-Nordheim tunneling mechanism. As electrons are transferred from the floating gate to the p-well region, the $V_{TH}$ of a selected cell is lowered. Erasing can be performed on the entire memory array, on individual blocks, or another unit of cells.

In step 904, a set of erase verify conditions are applied to the memory cells. The target $V_{TH}$ could be positive or negative. In some embodiments, sensing for a positive $V_{TH}$ involves applying a positive reference voltage to word lines and determining whether the NAND string conducts a current in response.

In one implementation, source follower sensing is employed for sensing for a negative $V_{TH}$. Step 904 may include discharging bit lines to ground, which may be achieved by turning on the drain side select gate (SGD). Then, a higher than zero voltage (e.g., 2.2V) is applied to the common source line and a certain voltage (e.g., 0V) is applied to the word lines. Charge builds up on the bit line of a given NAND string until the body effect turns off at least one memory cell in the NAND string. However, other sensing techniques can be used.

In step 906, each of the NAND strings is sensed to determine whether all of the memory cells on the NAND string were sufficiently erased. Step 906 is performed after waiting for a predetermined period of time for the charge to build up on the bit line, in one embodiment. In one implementation, the voltage on a given bit line is compared to a reference value to determine whether any of the memory cells on the corresponding NAND string have a $V_{TH}$ that is above the target value. The target value could be a negative value. In some implementations, the memory cells are erased to as much as −3V.

In one embodiment, if it is detected that the $V_{TH}$ of each memory cell on a NAND string has reached the target level, then the data stored in the corresponding data latch is changed to a logic "1." If it is detected that the NAND string has at least one memory cell with a $V_{TH}$ that has not reached the appropriate target level, the data stored in the corresponding data latch is not changed.

In step 908, a determination is made as to whether enough NAND strings passed erase verification. In one implementation, a certain number of NAND strings are allowed to fail erase verification. For example, providing that fewer than 32 NAND strings failed erase verification, the overall erase verification passes. If erase passed, then the process concludes.

If, at step 908, it is determined that erase verification failed, then the erase voltage is increased in step 910. The erase voltage can be increased by any desired amount such as 0.2 V, 0.5 V, 1.0 V, etc. The new erase voltage is applied in step 902.

Figure 10A:
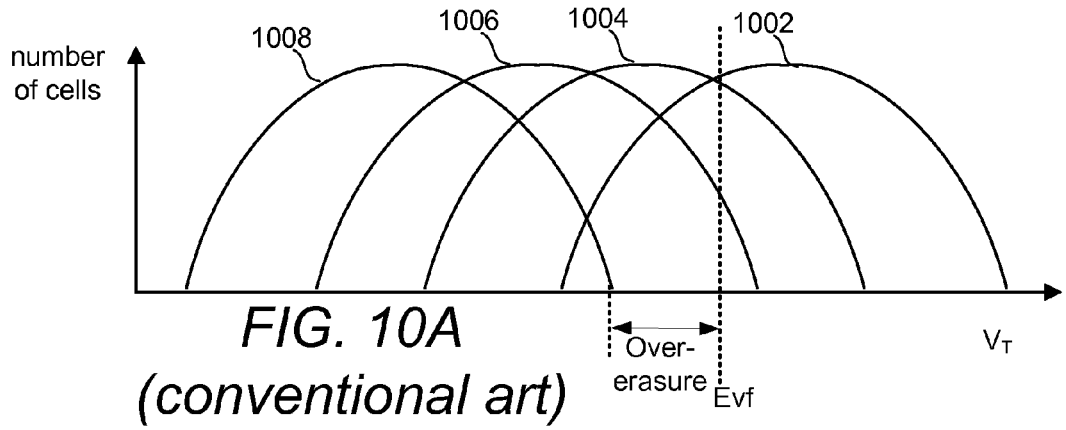
FIGS. 10A-10C depict example threshold distributions during a conventional erase process.
Figure 10B:
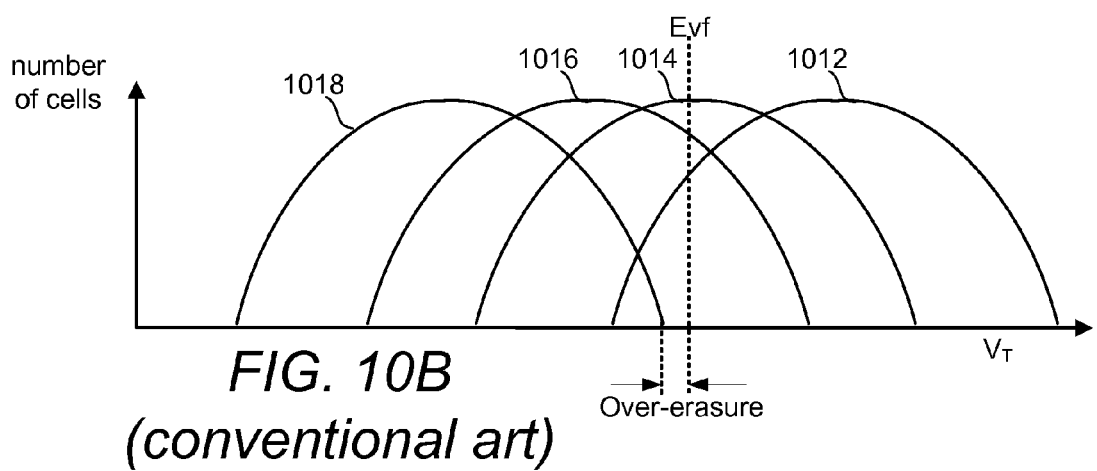
Figure 10C:
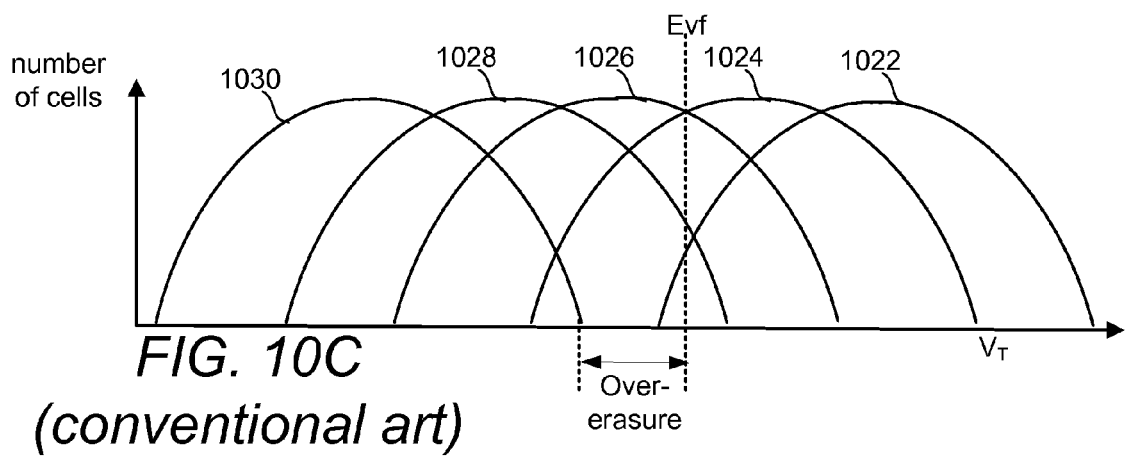

FIGS. 10A-10C depict example threshold distributions during a conventional erase process, such as the one of FIG. 9. FIG. 10A depicts example threshold distributions 1002-1008 at four different stages of an erase procedure. That is, each distribution corresponds to application of one additional erase pulse. Distribution 1002 represents the earliest in time of the four distributions, with 1004, 1006, and 1008 following in that order. Referring back to FIG. 9, these may correspond to the $V_{TH}$ distribution for each loop of process 900. As noted at step 910, the erase voltage may be increased with each iteration. The memory cells are being verified for the threshold voltage level "Evf" in FIG. 10A. This refers to a final $V_{TH}$ level.

The application of each additional erase pulse may move the distribution by a significant amount. As can be seen, a significant number of memory cells have not yet been erased for distributions 1002-1006. In particular, distribution 1006 shows that there are still a significant number of memory cells having a threshold voltage greater than Evf. With the application of one additional erase pulse, the memory cells are moved to distribution 1008. The difference between the upper tail of distribution 1008 and Evf is referred to as "over-erasure." This is because the memory cells did not need to be erased quite so deeply. That is, distribution 1008 could be farther to the right (higher $V_{TH}$) and still pass erase. Note that it is not required that every memory cell has its threshold voltage below Evf for erase to pass. There may be some "outliers" (e.g., memory cells with $V_{TH}$ above Evf) that are not depicted in FIG. 10A. Also, as noted in the discussion of FIG. 9, one technique for verifying the memory cells is to verify on a NAND string basis, as opposed to testing each storage element separately.

Note that for many types of memory cells and erase techniques the distribution of threshold voltages that results from, for example, the first erase pulse changes with use of the memory array. For example, early in the life of the memory, application of a 10V erase pulse may result in a distribution centered at a threshold voltage of 0V. However, after further program/erase cycles the same 10V erase pulse may result in a distribution centered at a threshold voltage of 1V. Thus, a series of pulses that previously could sufficiently erase the memory may later not be sufficient, and more pulses or pulses with higher magnitudes are now required.

FIG. 10B depicts a further example of threshold distributions 1012-1018 at four different stages of an erase procedure. FIG. 10B is for an example after the memory cells have been through additional erase/program cycles relative to the example of FIG. 10A. This example differs from the one of FIG. 10A in that after the first erase pulse is applied, the memory cells are not quite as deeply erased. That is, for distribution 1012 fewer memory cells have their $V_{TH}$ below Evf, compared to distribution 1002. Further note that after the fourth erase pulse, the amount of over-erasure is actually less than for the example of FIG. 10A.

FIG. 10C depicts a further example of threshold distributions 1022-1030 after still more erase/program cycles. In this example, it takes five erase pulses to erase the memory cells. The fifth erase pulse results in a significant over-erasure. Note that the amount of over-erasure can change as a function of the number of erase cycles. Also, the amount of over-erasure can actually oscillate between significant over-erasure, low over erasure, significant over-erasure, etc.

FIG. 11 is a diagram that illustrates fail bit count (FBC) versus erase cycles for a conventional memory device. The diagram illustrates how FBC can oscillate as a result of change in the amount of over-erasure previously described. Also, the diagram illustrates how FBC can increase with increasing erase cycles, in general.

The curve shows the total FBC for the block as the number of erase/program cycles increases. ECC can correct for some degree of FBC. If the FBC is too high, then it may not be correctable by ECC. The line "uncorrectable" represents a point at which the FBC is too high to correct with the ECC being used.

The FBC oscillates as a function of erase/program cycles. The FBC increases for a while, and then sharply drops. The sharp drop corresponds to a point at which the erase loop increments. That is, this corresponds to a point at which an additional erase pulse is used. Referring to FIG. 10C, recall that when the erase loop incremented, this increases the amount of over-erasure. Hence, there is more stress on the memory cells at this point.

On the other hand, the peaks of the FBC curve correspond to the "just sufficiently erased" condition. That is, the FBC can be higher when the amount of over-erasure is small, as depicted in FIG. 10B. As noted, lower values on the FBC curve correspond to a deeper erase and worse endurance.

Note that the FBC can eventually reach a point at which it is not correctable by the ECC being used. Also note that the peak FBC can change as the memory cells undergo more erase cycles. The number of cycles at which the FBC is too high to correct is significant in that it is desirable for the memory cells to be able to endure more erase cycles. The amount of over-erasing can reduce the number of cycles prior to the FBC being uncorrectable by ECC. Thus, it can be desirable to reduce the amount of over-erasure such that endurance can be improved. Also, it is desirable that the overall time it takes to erase is either not increased (or at least increased by a small amount as opposed to a large increase in time) in an effort to improve endurance.

Embodiments disclosed herein increase the number of program/erase cycles that a group of memory cells (e.g., a block) is able to endure. Embodiments disclosed herein reduce the over-erasure of memory cells. Reducing the over-erasure improves endurance. Also, this endurance improvement may be achieved without significant sacrifice to the overall erase time.

Figure 12A:
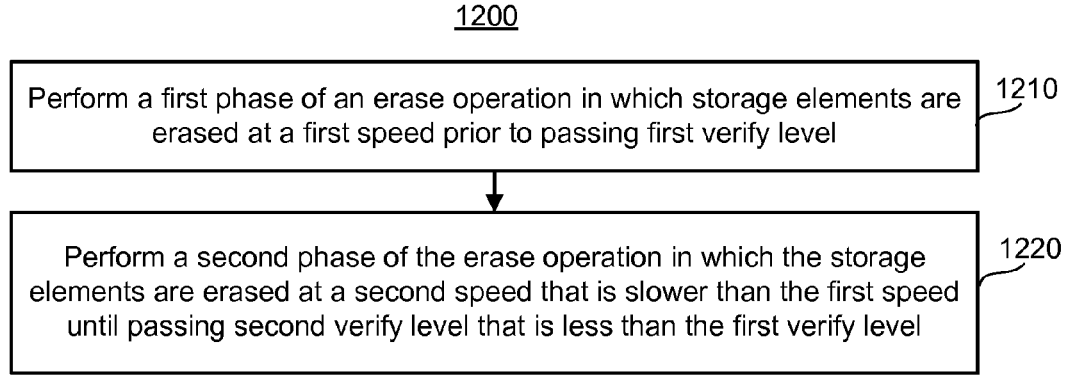
FIG. 12A is a flowchart of one embodiment of a process of erasing non-volatile storage.
Figure 12B:
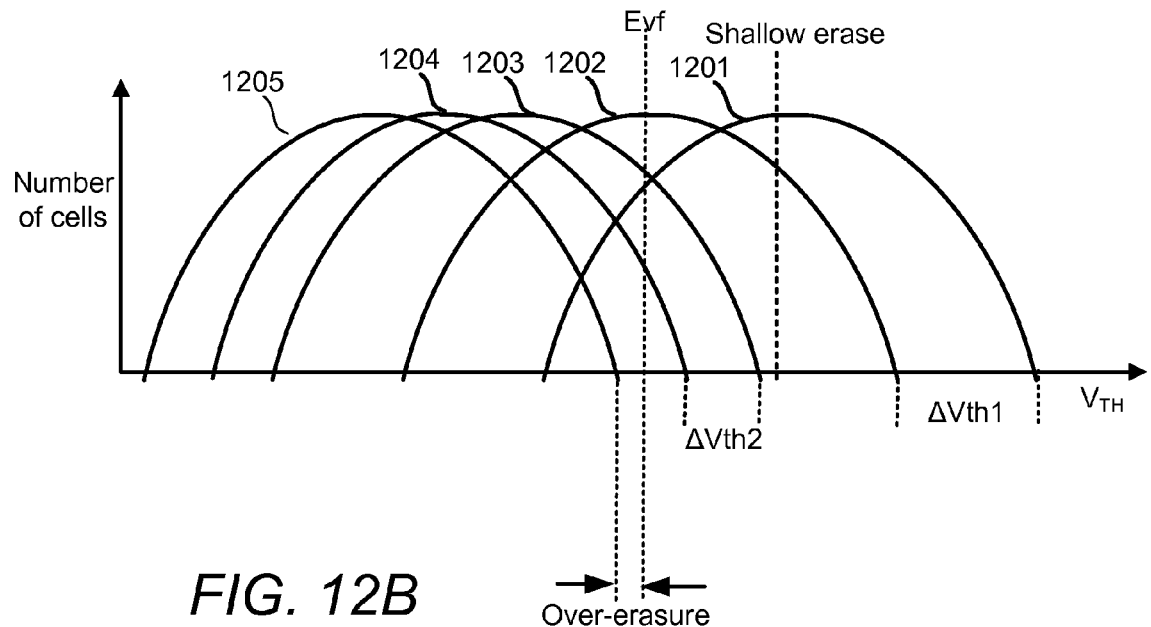
FIG. 12B shows some example erase distributions to help illustrate the process of FIG. 12A.

FIG. 12A is a flowchart of one embodiment of a process 1200 of erasing non-volatile storage. This process 1200 involves a first phase in which memory cells are erased at a faster speed and a second phase in which memory cells are erased at a slower speed. This process increases the endurance of the memory cells. FIG. 12B shows some example erase distributions to help illustrate this process.

In step 1210, a first phase of the erase operation is performed. In the first phase the memory cells are erased at a first speed, which is faster than they will be erased during the second phase. During phase 1, the verify level is higher than the final target level. Using this higher verify level may be referred to as a "shallow erase." Referring to FIG. 12B, the shallow erase level is depicted (labeled "shallow erase"), along with the final target level ("Evf"). During phase 1, the memory cells are verified for the shallow erase level. In one embodiment, NAND strings are verified.

In this example, it takes three erase pulses prior to the memory cells passing the verify at the shallow erase level. After the first erase pulse, the memory cells have $V_{TH}$ distribution 1201. After the second erase pulse, the memory cells have $V_{TH}$ distribution 1202. After the third erase pulse, the memory cells have $V_{TH}$ distribution 1203.

In step 1220, a second phase of the erase operation is performed. In the second phase the memory cells are erased at a second speed, which is slower than they were erased during the first phase. During phase 2, the verify level is the final target level in this example. However, there could be more than two phases.

In the example of FIG. 12B, it takes two additional erase pulses for the memory cells to pass the verify at the final level. After the first erase pulse of the second phase, the memory cells have distribution 1204. After the second erase pulse of the second phase, the memory cells have distribution 1205. Again, the rate at which the memory cells are being erased is reflected by the amount by which the $V_{TH}$ distributions shift. Slowing the speed of erasure during phase 2 helps to prevent over-erasure, which in turn helps to increase endurance. In effect, the slower speed during phase 2 may result in additional erase pulses being used. However, it allows for more precise movement of the erase $V_{TH}$ distribution. That is, it allows the erase $V_{TH}$ distribution to be moved by smaller amounts with each erase pulse.

The rate at which the memory cells are being erased is reflected by the amount by which the $V_{TH}$ distributions shift. The memory cells are erased at a faster rate during phase 1 than during phase 2. The erase pulse that pushed the memory cells from distribution 1201 to 1202, erased the memory cells at a speed of $\Delta V_{TH1}$. The erase pulse that pushed the memory cells from distribution 1203 to 1204, erased the memory cells at a speed of $\Delta V_{TH2}$. $\Delta V_{TH2}$ is less than $\Delta V_{TH1}$; therefore, this is a slower erase, as defined herein. It is not required that every erase pulse in phase 1 be the exact same speed. That is, it is not required that the movement be exactly $\Delta V_{TH1}$ for every pulse during phase 1. Likewise, it is not required that every erase pulse in phase 2 be the exact same speed. That is, it is not required that the movement be exactly $\Delta V_{TH2}$ for every pulse during phase 2. In this example, the change in $V_{TH}$ distribution was measured at the upper tail. However, it could be measured at some other point, such as the median $V_{TH}$ of the group under erase.

The process of FIG. 12A can be used for 2D NAND or 3D NAND. In one 2D NAND embodiment, the erase is achieved by raising the p-well to an erase voltage for a sufficient period of time and grounding the word lines of a selected block while the source and bit lines are floating. Due to capacitive coupling, the unselected word lines, bit lines, select lines, and the common source line are also raised to a significant fraction of the erase voltage. A strong electric field is thus applied to the tunnel oxide layers of selected memory cells and the data of the selected memory cells are erased as electrons of the floating gates are emitted to the substrate side, typically by Fowler-Nordheim tunneling mechanism. As electrons are transferred from the floating gate to the p-well region, the $V_{TH}$ of a selected cell is lowered. Erasing can be performed on the entire memory array, on individual blocks, or another unit of cells.

Erase for 3D NAND is typically different than 2D NAND. In contrast, the NAND strings in a 3D stacked non-volatile memory device such as BiCS do not necessarily reside in a substrate. One approach to erasing is to generate gate induced drain leakage (GIDL) current to charge up the channel, raise the channel potential to an erase voltage, and maintain this channel potential during erase. Further details for erasing 3D NAND are described in: (1) U.S. Patent Publication 2013/0279257, entitled "Erase Operation for 3D Non-Volatile Memory with Controllable Gate Induced Drain Leakage Current," by Costa et al.; and (2) U.S. Patent Publication 2013/0163336, entitled "Erase Operation with Controlled Select Gate Voltage for 3D Non-Volatile Memory," by Li et al.; both of which are hereby incorporated by reference.

Various techniques can be used to alter the speed of erase between the first and second phases. One technique is to use a smaller step size of the increase in magnitude of the erase voltage with each program loop. For example, a smaller step size is used during the second phase than the first phase. Another technique is to alter the time duration of the erase pulse. For example, the first phase can have large increases in time duration, and the second phase can have small increases in time duration. As another example, a shorter duration erase pulse is used during the second phase than the first phase. Still another technique is to change the number of erase pulses used between verify operations. For example, the first phase can have a large increase in the number of pulses between verifies, and the second phase can have a small increase in the number of pulses between verifies. As another example, fewer erase pulses are used between verifies during the second phase than the first phase. Any combination of these three techniques could be used to create a slower speed of erase in the second phase.

Note that there may be more than two phases. Each phase can employ a different erase verify level. Also, each phase can use a different speed. In one embodiment, the erase speed is slowed with each progressive phase.

FIG. 13A-13E show several different embodiments of erase signals for altering the speed of erase. The erase pulses are applied to the substrate in one embodiment. NAND strings may be formed in the substrate. However, the erase signals can be applied for NAND strings that are not formed in a substrate, such as some 3D NAND devices. Each example is for two phases, although the concepts can be expanded to three or more phases. As already noted, each additional phase can further slow the erase speed.

In the examples of FIGS. 13A-13C, the erase operation is a series of erase pulses, with a verify operation after each pulse. In FIG. 13A, during phase 1, the magnitude of the erase pulse is increased by ΔVera1 with each new pulse. After each pulse, the memory cells are verified for the level "Evfy1." After the memory cells pass this verify level, phase 2 is entered. In phase 2, the erase pulse is increased by ΔVera2 with each new pulse. ΔVera2 is smaller in magnitude than ΔVera1. Stepping up the magnitude of the erase voltage by a smaller amount in phase 2 has the effect of slowing down the speed of erase. That is, the amount by which the $V_{TH}$ distribution shifts down is slower in phase 2.

In phase 2, the memory cells are verified for the level "Evfy2," which is lower than Evfy1. Note that Evfy1 and/or Evfy2 may be negative voltages. Alternatively, Evfy1 may be positive a voltage, in which case Evfy2 may be a positive or negative voltage.

FIG. 13B shows another embodiment in which the erase speed is adjusted based, in part, on the duration of the erase pulse. In this example, the erase operation is a series of erase pulses, with a verify operation after each pulse. The time duration of the pulse increases from one pulse to the next. However, the increase in time duration of the pulses are different in the two phases. For example, there might be a five microsecond increase during phase 1, and a 2 microsecond increase during phase 2. As another example, the percent increase in time duration can be different between the two phases. For example, there might be a 20% increase in duration from one pulse to the next in the first phase and a 10% increase in duration from one pulse to the next in the second phase. The erase pulses are applied to the substrate in one embodiment. NAND strings may be formed in the substrate.

The magnitude of the erase pulses stays constant in the example of FIG. 13B. However, the step size could change during the process. Thus, the technique of FIG. 13B could be combined with, for example, the technique of FIG. 13A.

FIG. 13C shows one embodiment in which the erase speed is adjusted based, in part, on the time duration of the erase pulse. In this example, the erase operation is a series of erase pulses, with a verify operation after each pulse. However, the time duration of the pulses are different in the two phases. The smaller pulse duration during phase 2 slows the erase speed.

In FIG. 13C, the erase pulses have a longer duration during phase 1 than for phase 2. In the simplest example, the time duration of the pulses in phase 1 are all the same. Likewise, the time duration of the pulses in phase 2 are all the same. However, during phase 1, the magnitude of the pulses increase from one pulse to the next. Likewise, during phase 2, the magnitude of the pulses increase from one pulse to the next. In the simplest case, the magnitude by which the erase voltage is increased from one pulse to the next is the same during both phase 1 and phase 2. However, the magnitude change could be different in phase 1 than for phase 2. Also, the magnitude change for the first pulse in phase 2 may be different from other magnitude changes, as a result of the fact that the pulse duration changes for that pulse.

Figure 13D:
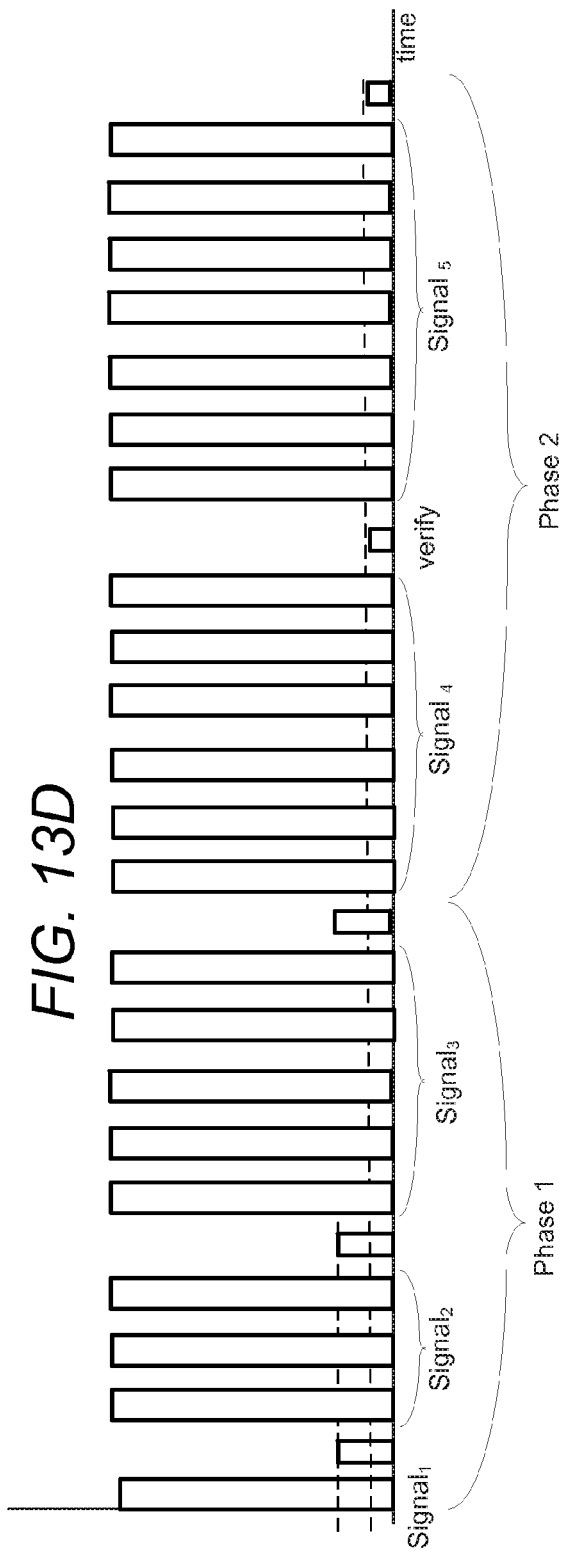

FIG. 13D shows another embodiment in which the erase speed is adjusted based, in part, on the number of erase pulses in the erase signal. Here, one or more erase pulses may be performed prior to verifying the memory cells. All of the erase pulses between verifies are considered to be part of the same erase signal.

During phase 1, the number of erase pulses between verifies increases by a first number of pulses. In this example, the increase is two pulses (from 1 to 3 to 5). During phase 2, the number of erase pulses between verifies increases by a second number of pulses that is less than the first number of pulses. In this example, the increase is one pulse (from 6 to 7). Therefore, the speed of erase during phase 2 is less than phase 1.

The magnitude of the erase pulses stays constant in the example of FIG. 13D. However, the step size in voltage magnitude could change during the process. Thus, this technique could be combined with, for example, the technique of FIG. 13A. The duration of the erase pulses stays constant in this example. However, the duration could change during the process. Thus, this technique could be combined with, for example, the technique of FIG. 13B.

Figure 13E:
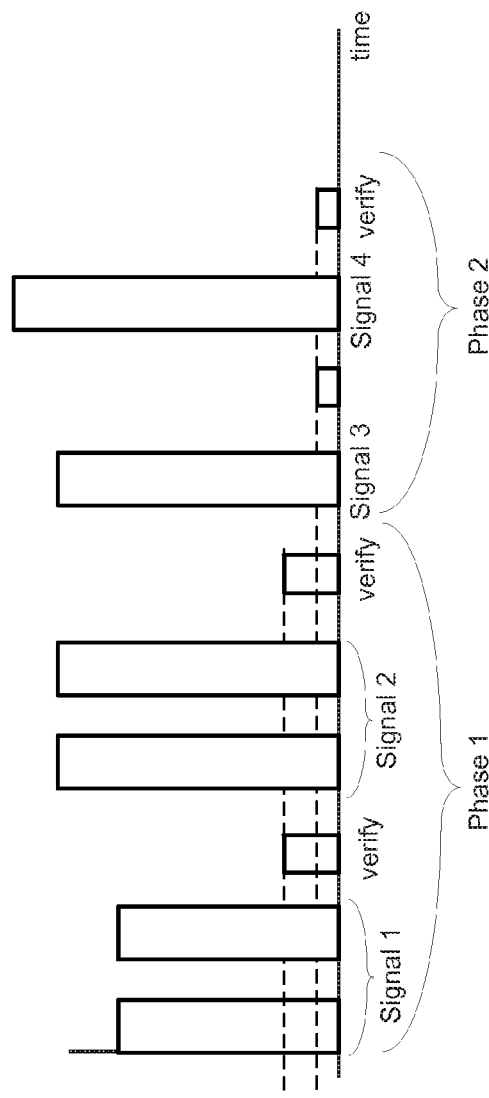

FIG. 13E shows one embodiment in which the erase speed is adjusted based, in part, on the number of erase pulses in the erase signal. Here, multiple erase pulses may be performed prior to verifying the memory cells. All of the erase pulses between verifies are considered to be part of the same erase signal.

During phase 1, each erase signal has two pulses. During phase 2, each erase signal has a single pulse, in this example. More generally, each erase signal has more pulses during phase 1 than phase 2. For example, there could be three pulses per signal during phase 1, two pulses/signal during phase 2, etc. In this example, there is also an increase in the magnitude of the erase voltage from one erase signal to the next. The step size in the magnitude increase can be the same throughout the process. However, it could also change as in, for example, FIG. 13A.

Numerous other techniques can be used to change the speed of erase of the second phase relative to the second phase.

Figure 14A:
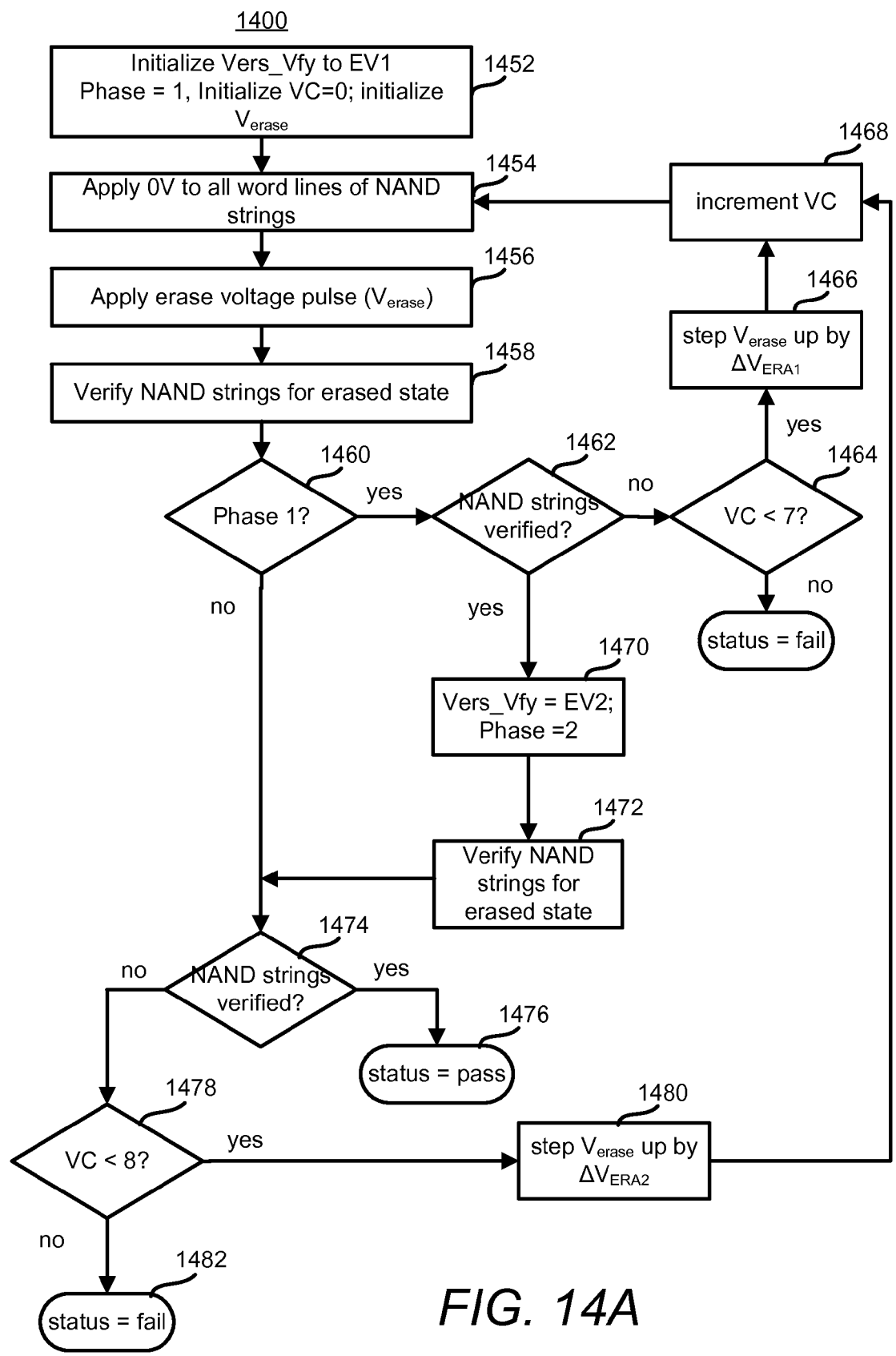
FIG. 14A is a flowchart of one embodiment of a process of erasing memory cells that employs a faster first phase and a slower second phase in which an erase voltage step size is adjusted.

FIG. 14A is a flowchart of one embodiment of a process 1400 of erasing memory cells that employs a faster first phase and a slower second phase. In this embodiment, the change in speed is achieved by increasing the step size of the magnitude of the erase pulse by different magnitudes in the two phases. The example of FIG. 13A will be referred to when discussing process 1400. The process 1400 could be used to erase some unit such as a block of NAND strings. However, the process 1400 can be used on some of other unit. For the sake of discussion, process 1400 describes erasing a group of 2D NAND strings. However, the process can be modified for memory other than 2D NAND.

In step 1452, the erase verification reference voltage (Vers_Vfy) is initialized to EV1. This is a higher erase level, and is not the final target erase level. The phase is initialized to "1". This can be tracked by logic on the memory die. A verify count (VC) is initialized to 0. The verify count is used to limit the number of loops of the erase process. Also, the magnitude of the erase voltage ($V_{ERASE}$) is initialized.

In step 1454, 0V is applied to all word lines associated with the memory cells under erase. In some embodiments, a voltage other than 0V is applied to the word lines.

In step 1456, an erase voltage pulse is applied to the group of storage elements. In one embodiment, the erase voltage pulse is applied to a substrate in which the NAND strings reside.

In step 1458, the NAND strings are verified. This tests for the higher erase verify level. The process then branches depending on whether this is phase 1 (step 1460). If this is phase 1, the step 1462 determines whether the NAND strings are verified. A certain number of NAND strings are permitted to fail erase verify with step 1462 passing.

Assuming that not enough NAND strings have passed verify, the process continues to step 1464. Step 1464 tests whether the verify count (VC) has exceeded a limit. Seven is used as an example, but this could be higher or lower. If VC has exceeded the limit without the memory cells passing erase verify, then the status is set to "fail." Otherwise, the process goes to step 1466 in which $V_{ERASE}$ is increased by $\Delta V_{ERA1}$. Referring back to FIG. 13A, between pulse 1 and pulse 2, $V_{ERASE}$ is increased by $\Delta V_{ERA1}$. The verify count (VC) is incremented by one in step 1468. Then, control passes to step 1454 to again apply the voltage to the word lines, etc.

Returning again to step 1462, eventually the NAND strings should pass verify at EV1. In response to that, the verify level is set to the final target erase level in step 1470. Thus, Vers-_Vfy is set to EV2. Also, the phase is set to phase 2.

In step 1472, the memory cells are verified for the new erase level. Step 1474 test whether the NAND strings have passed the final target erase level. Again, not all NAND strings need to pass the final target erase level for this test to pass. If the test passes, then the process concludes in step 1476 with a status of pass.

If the test does not pass (step 1474=no), then the process continues to step 1478 to again test the verify count (VC). In this example, the threshold is one higher than it was in step 1464. In general, the threshold should be at least as high as it was in step 1464. The threshold could be greater or less than eight.

If the threshold is not exceeded (step 1478=yes), then control passes to step 1480. In step 1480, $V_{ERASE}$ is increased by $\Delta V_{ERA2}$. $\Delta V_{ERA2}$ is lower in magnitude than $\Delta V_{ERA1}$. This results in the speed of erase being slowed. Control then passes to step 1468 to increment the verify count (VC). In steps 1454 and 1456, the erase conditions are applied. In step 1458, the NAND strings are verified for the final target level EV2. Step 1460 should result in control passing to step 1474, as this is now phase 2. In the event that step 1478 results in the verify count exceeding the threshold, then the process ends with a status of "fail," in step 1482.

Figure 14B:
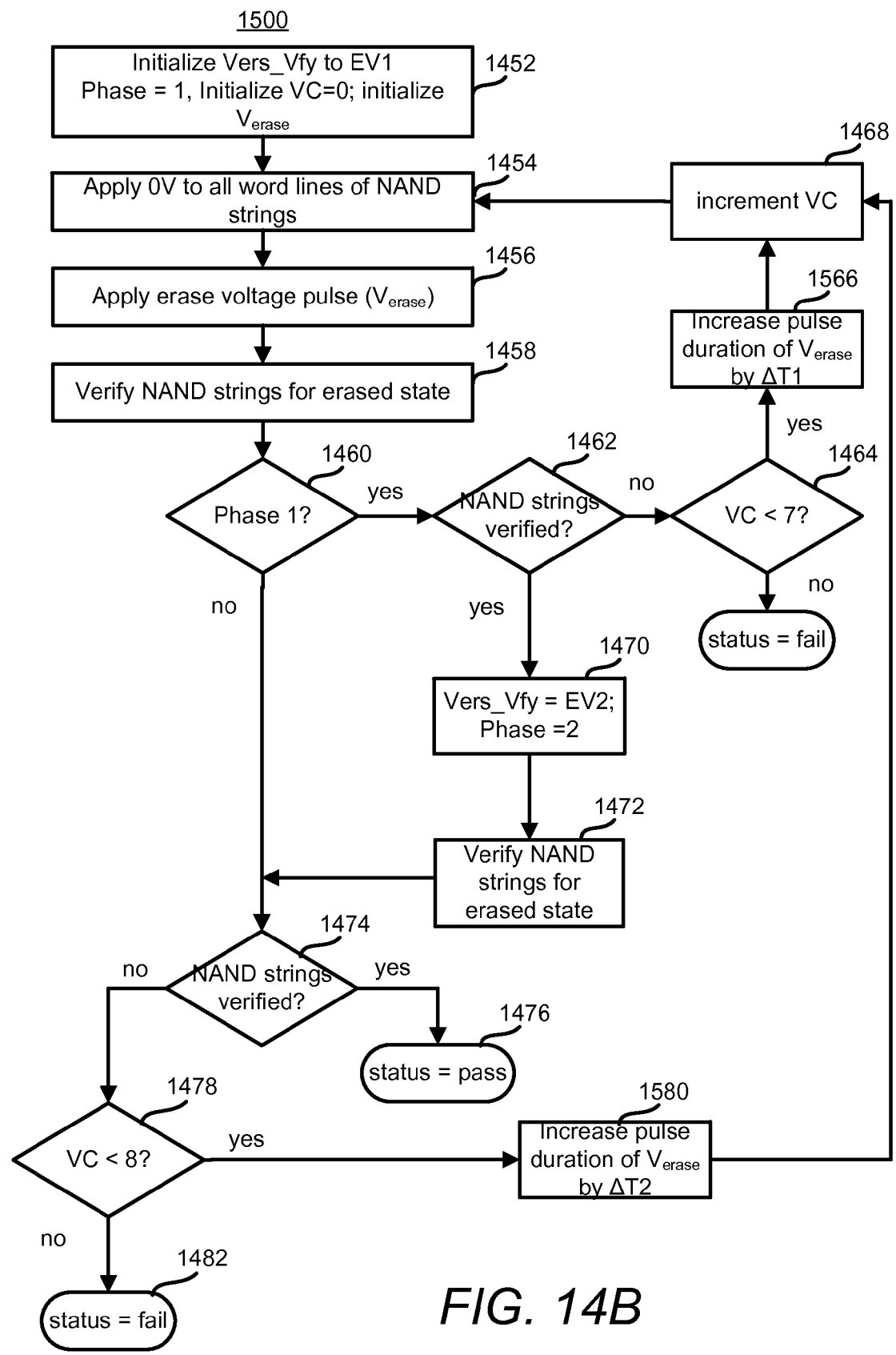
FIG. 14B is a flowchart of one embodiment of a process of erasing memory cells that employs a faster first phase and a slower second phase in which a change in pulse duration from one loop to the next is adjusted.

FIG. 14B is a flowchart of one embodiment of a process 1500 of erasing memory cells that employs a faster first phase and a slower second phase. Many of the steps of process 1500 are similar to those of process 1400, and thus will not be discussed in detail. The same reference numerals have been used when the steps are similar.

In process 1500, the time duration of the erase pulses are changed from one loop to the next. Thus, there is some increment in the change in time duration from one loop to the next. The increment is increased by a first amount $\Delta T1$ in phase 1 (step 1566) and by a second amount $\Delta T2$ in phase 2 (step 1580). FIG. 13B depicts one example of a sequence of erase pulses that could be used in process 1500. Note that $\Delta T1$ could be some time period (e.g., 5 microseconds) or some time percentage (e.g., 20% time increase). Likewise, note that $\Delta T2$ could be some time period (e.g., 2 microseconds) or some time percentage (e.g., 10% time increase).

Figure 14C:
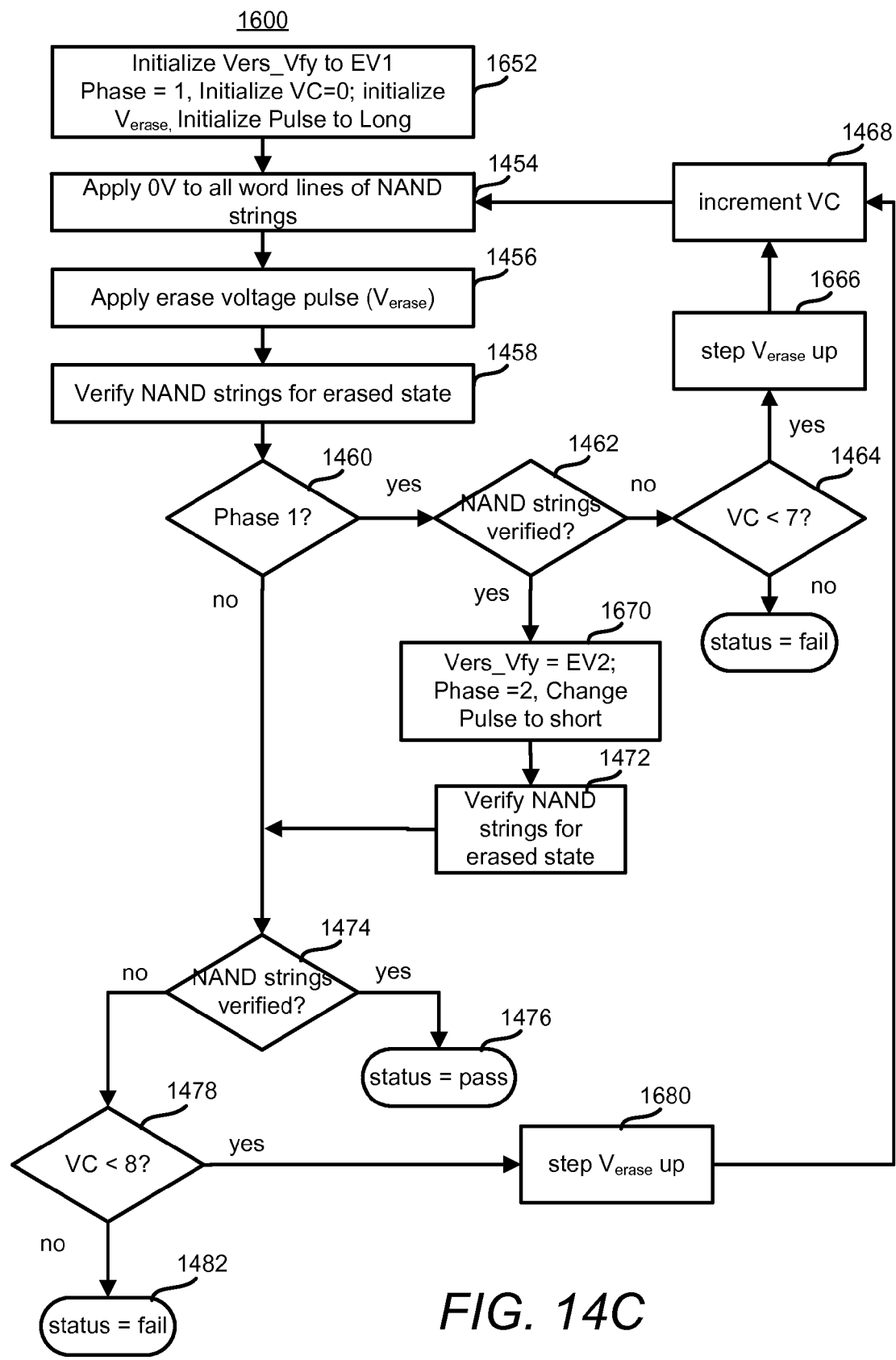
FIG. 14C is a flowchart of one embodiment of a process of erasing memory cells that employs a faster first phase and a slower second phase in which a pulse duration is adjusted.

FIG. 14C is a flowchart of one embodiment of a process 1600 of erasing memory cells that employs a faster first phase and a slower second phase. In this embodiment, the duration of the erase pulse is different in the two phases in order to achieve the two speeds. FIG. 13C depicts one example of the erase voltages that can be applied during process 1600. Note that the pulse duration is longer in the first phase than the second phase.

Many of the steps of process 1600 are similar to those of process 1400, and thus will not be discussed in detail. The same reference numerals have been used when the steps are similar.

In step 1652, various conditions are initialized. This includes initializing a pulse duration to long. The process 1600 is similar to process 1400, with the process testing for phase 1 at step 1460. In step 1666, the erase voltage is stepped up. Note that there does not need to be two different voltage magnitude step size increases in process 1600. However, that is one possibility. In other words, the speed can be decreased by using a smaller voltage magnitude step size in step 1680 (compared to the step size of step 1666).

Another difference between process 1400 and 1600 is that after the memory cells have passed the higher verify level (step 1462=yes), the pulse duration is changed to short in step 1670.

Figure 14D:
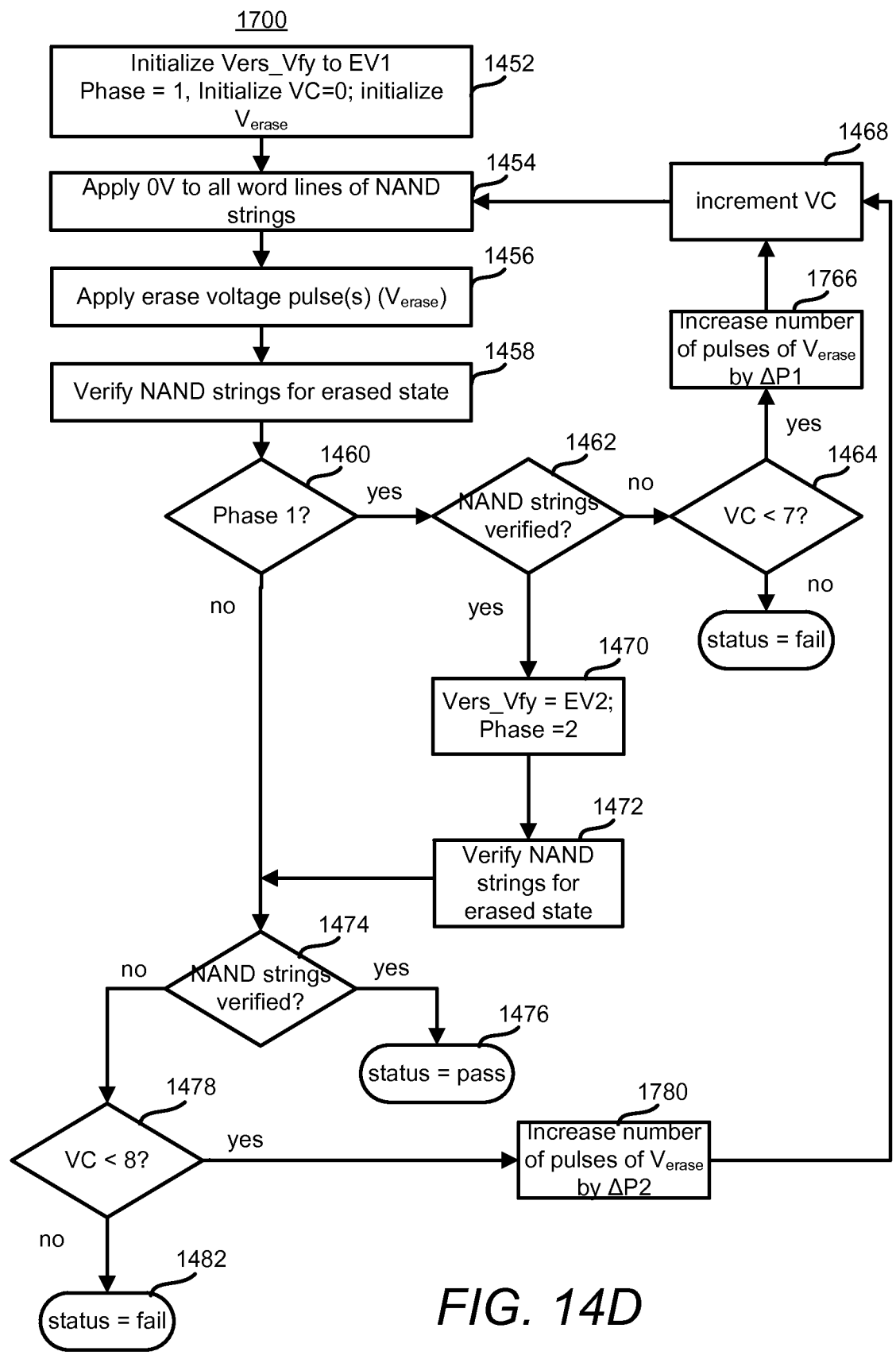
FIG. 14D is a flowchart of one embodiment of a process of erasing memory cells that employs a faster first phase and a slower second phase in which the increase in the number of erase pulses between verifies is adjusted.

FIG. 14D is a flowchart of one embodiment of a process 1700 of erasing memory cells that employs a faster first phase and a slower second phase. In this embodiment, the number of erase pulses between verifies are changed from one loop to the next. Thus, there is some increment in the number of erase pulses from one loop to the next. FIG. 13D shows one example of erase pulses that can be used in process 1700. The increase in the number of erase pulses is increased by a first amount $\Delta P1$ in phase 1 (step 1766) and by a second amount $\Delta P2$ in phase 2 (step 1780).

The magnitude of the erase voltage does not need to be stepped up from one erase loop to the next in process 1700. However, optionally this could be performed. For example, by adding steps 1466 and 1480 to process 1700, the step size of the magnitude of the erase voltage is another factor that can be used to adjust the erase speed.

Figure 14E:
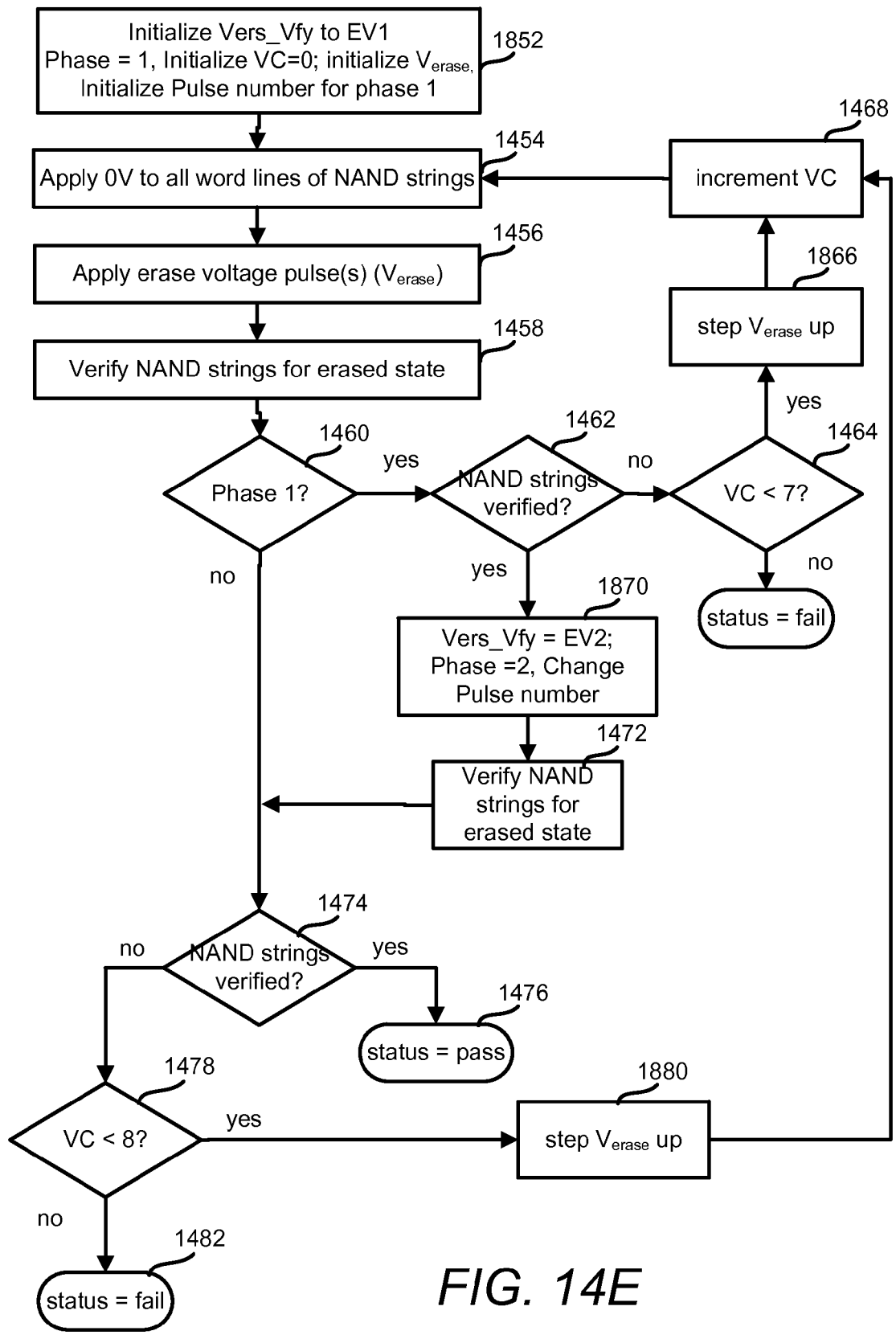
FIG. 14E is a flowchart of one embodiment of a process of erasing memory cells that employs a faster first phase and a slower second phase in which the number of erase pulses between verifies is adjusted from the first phase to the second.

FIG. 14E is a flowchart of one embodiment of a process 1800 of erasing memory cells that employs a faster first phase and a slower second phase. In this embodiment, the number of erase pulses between verifies are different in the two phases in order to achieve the two speeds. FIG. 13E depicts one example of the erase voltages that can be applied during process 1800.

Many of the steps of process 1800 are similar to those of process 1400, and thus will not be discussed in detail. The same reference numerals have been used when the steps are similar. In step 1852, various conditions are initialized. This includes initializing the number of pulses. In step 1866, the erase voltage is stepped up. Note that there does not need to be two different step voltage magnitude size increases in process 1800. However, that is one possibility. In other words, the speed can be decreased by using a smaller voltage magnitude step size in step 1880, relative to step 1866.

Another difference between process 1800 and 1400 is that after the memory cells have passed the higher verify level (step 1462=yes), the number of pulses duration is changed in step 1870. Referring to FIG. 13E, the second phase may employ fewer pulses between verifies, which slows the erase speed.

One embodiment disclosed herein includes a method of operating non-volatile storage. The method comprises performing a first phase of an erase operation, including erasing a group of non-volatile storage elements at a first speed until the group of non-volatile storage elements pass a first verify level; and after the group of non-volatile storage elements pass the first verify level, performing a second phase of the erase operation, including erasing the group of non-volatile storage elements at a second speed that is less than the first speed until the group of non-volatile storage elements pass a second verify level that is lower than the first verify level.

One embodiment includes a non-volatile storage device, comprising a plurality of non-volatile storage elements, and one or more managing circuits in communication with the plurality of non-volatile storage elements. The one or more managing circuits perform a first phase of an erase operation in which the one or more managing circuits erase a group of the non-volatile storage elements at a first rate until the group of non-volatile storage elements pass a first verify level. The one or more managing circuits perform a second phase of the erase operation after the group of non-volatile storage elements pass the first verify level. In the second phase the one or more managing circuits erase the group of non-volatile storage elements at a second rate that is less than the first rate until the group of non-volatile storage elements pass a second verify level that is lower than the first verify level.

One embodiment includes a method of operating non-volatile storage, which comprising the following: a) applying an erase pulse to a group of non-volatile storage elements; b) verifying whether the group of non-volatile storage elements have a threshold voltage below a first voltage level as a result of applying the erase pulse; c) increasing a voltage magnitude of the erase pulse by a first amount if the group of non-volatile storage elements do not pass verify at the first voltage level. Steps a)-c) are repeated until the group of non-volatile storage elements pass verify at the first voltage level (step d). Further steps include: e) increasing the voltage magnitude of the erase pulse by a second amount in response to the group of non-volatile storage elements passing verify at the first voltage level, the second amount is less than the first amount; f) applying the erase pulse to the group of non-volatile storage elements after increasing the voltage magnitude of the erase pulse by the second amount; g) verifying whether the group of non-volatile storage elements have a threshold voltage below a second voltage level as a result of applying the erase pulse, the second level is lower than the first level. Steps e)-g) are repeated until the group of non-volatile storage elements pass verify at the second voltage level.

One embodiment includes a non-volatile storage device, comprising a plurality of non-volatile storage elements, and one or more managing circuits in communication with the plurality of non-volatile storage elements. The one or more managing circuits perform a first phase of an erase operation in which the one or more managing circuits apply a first series of one or more erase signals to a group of the non-volatile storage elements that each move a threshold distribution of the group down by a first amount. The one or more managing circuits perform a second phase of the erase operation in which the one or more managing circuits apply a second series of erase signals to the group of non-volatile storage elements that each move the threshold distribution of the group down by a second amount that is less than the first amount. The one or more managing circuits perform the first phase until the group of the non-volatile storage elements pass verify at a first threshold voltage level, the one or more managing circuits perform the second phase after the group of non-volatile storage elements pass verify at the first threshold voltage level and until the group of non-volatile storage elements pass verify at a second threshold voltage level that is less than the first threshold voltage level.

In addition to NAND, the techniques provided herein are applicable to other non-volatile storage technologies including NOR.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method of operating non-volatile storage, comprising:
   performing a first phase of an erase operation, including erasing a group of non-volatile storage elements at a first speed until the group of non-volatile storage elements pass a first verify level; and
   after the group of non-volatile storage elements pass the first verify level, performing a second phase of the erase operation, including erasing the group of non-volatile storage elements at a second speed that is less than the first speed until the group of non-volatile storage elements pass a second verify level that is lower than the first verify level.

2. The method of claim 1, wherein the erasing the group of non-volatile storage elements at the first speed comprises increasing a step size of an erase voltage that is applied to the group of non-volatile storage elements by a first voltage magnitude, the erasing the group of non-volatile storage elements at the second speed comprises increasing a step size of an erase voltage that is applied to the group of non-volatile storage elements by a second voltage magnitude that is less than the first voltage magnitude.

3. The method of claim 1, wherein the erasing the group of non-volatile storage elements at the first speed comprises applying an erase voltage having a first duration to the group of non-volatile storage elements, the erasing the group of non-volatile storage elements at the second speed comprises applying an erase voltage having a second duration to the group of non-volatile storage elements that is less than the first duration.

4. The method of claim 1, wherein the erasing the group of non-volatile storage elements at the first speed comprises increasing a time duration of an erase voltage that is applied to the group of non-volatile storage elements by a first amount, the erasing the group of non-volatile storage elements at the second speed comprises increasing a time duration of an erase voltage that is applied to the group of non-volatile storage elements by a second amount that is less than the first amount.

5. The method of claim 1, wherein the erasing the group of non-volatile storage elements at the first speed comprises applying a first number of erase pulses to the group of non-volatile storage elements prior to verifying whether the group of non-volatile storage elements pass the first verify level, the erasing the group of non-volatile storage elements at the second speed comprises applying a second number of erase pulses to the group of non-volatile storage elements prior to verifying whether the group of non-volatile storage elements pass the second verify level, the second number is less than the first number.

6. The method of claim 1, wherein the erasing the group of non-volatile storage elements at the first speed comprises increasing the number of erase pulses that are applied prior to verifying whether the group of non-volatile storage elements pass the first verify level by a first number of pulses, the erasing the group of non-volatile storage elements at the second speed comprises increasing the number of erase pulses that are applied prior to verifying whether the group of non-volatile storage elements pass the first verify level by a second number of pulses, the second number is less than the first number.

7. The method of claim 1, wherein the group of non-volatile storage elements are arranged as NAND strings in a substrate, the erasing the group of non-volatile storage elements at the first speed and the erasing the group of non-volatile storage elements at the second speed comprise applying erase voltages to the substrate.

8. The method of claim 1, wherein the erasing the group of non-volatile storage elements at the first speed includes:
   applying a first erase signal to the group of non-volatile storage elements that moves a threshold distribution of the group by a first amount;
   the erasing the group of non-volatile storage elements at the second speed includes:
   applying a second erase signal to the group of non-volatile storage elements that moves the threshold distribution of the group by a second amount that is less than the first amount.

9. The method of claim 1, further comprising:
   after the group of non-volatile storage elements pass the second verify level, performing a third phase of the erase operation in which the group of non-volatile storage elements are erased at a third speed that is less than the second speed until the group of non-volatile storage elements pass a third verify level that is lower than the second verify level.

10. A non-volatile storage device, comprising:
    a plurality of non-volatile storage elements; and
    one or more managing circuits in communication with the plurality of non-volatile storage elements, the one or more managing circuits are configured to perform a first phase of an erase operation including the one or more managing circuits being configured to erase a group of the non-volatile storage elements at a first rate until the group of non-volatile storage elements pass a first verify level, wherein the one or more managing circuits are configured to perform a second phase of the erase operation after the group of non-volatile storage elements pass the first verify level including the one or more managing circuits being configured to erase the group of non-volatile storage elements in the second phase at a second rate that is less than the first rate until the group of non-volatile storage elements pass a second verify level that is lower than the first verify level.

11. The non-volatile storage device of claim 10, wherein the one or more managing circuits are configured to increase a step size of an erase voltage that is applied to the group of non-volatile storage elements in the first phase of the erase operation by a first voltage magnitude, wherein the one or more managing circuits are configured to increase a step size of an erase voltage that is applied to the group of non-volatile storage elements in the second phase of the erase operation by a second voltage magnitude that is less than the first voltage magnitude.

12. The non-volatile storage device of claim 10, wherein the one or more managing circuits are configured to increase a time duration of an erase voltage applied to the group of non-volatile storage elements in the first phase of the erase operation by a first amount, wherein the one or more managing circuits are configured to increase a time duration of an erase voltage applied to the group of non-volatile storage elements in the second phase of the erase operation by a second amount that is less than the first amount.

13. The non-volatile storage device of claim 10, wherein the one or more managing circuits are configured to increase the number of erase pulses applied to the group of non-volatile storage elements in the first phase of the erase operation prior to verifying whether the group of non-volatile storage elements pass the first verify level by a first number of pulses, wherein the one or more managing circuits are configured to increase the number of erase pulses applied to the group of non-volatile storage elements in the second phase of the erase operation prior to verifying whether the group of non-volatile storage elements pass the second verify level by a second number of pulses, wherein the second number is less than the first number.

14. The non-volatile storage device of claim 10, wherein the group of non-volatile storage elements are arranged as NAND strings in a substrate, wherein the one or more managing circuits being configured to erase at the first rate and the second rate includes the one or more managing circuits being configured to applying erase voltages to the substrate, wherein the one or more managing circuits being configured to erase at the first rate comprises the one or more managing circuits being configured to apply a first erase signal to the group of non-volatile storage elements and being configured to verify whether the group of non-volatile storage elements pass the first verify level as a result of applying the first erase signal, wherein the one or more managing circuits being configured to erase at the second rate comprises the one or more managing circuits being configured to apply a second erase signal to the group of non-volatile storage elements and being configured to verify whether the group of non-volatile storage elements pass the second verify level as a result of applying the second erase signal.

15. The non-volatile storage device of claim 10, wherein the one or more managing circuits are further configured to perform a third phase of the erase operation after the group of non-volatile storage elements pass the second verify level, wherein the one or more managing circuits are configured to erase the group of non-volatile storage elements in the third phase at a third rate that is less than the second rate until the group of non-volatile storage elements pass a third verify level that is lower than the second verify level.

16. The non-volatile storage device of claim 10, wherein the first rate moves a threshold distribution of the group of non-volatile storage elements by a first amount, the second rate moves the threshold distribution of the group of non-volatile storage elements by a second amount that is less than the first amount.

17. The method of claim 1, wherein the non-volatile storage comprises a three-dimensional array of non-volatile storage elements, wherein the group of non-volatile storage elements are part of the three-dimensional array.

18. The method of claim 1, wherein the erasing the group of non-volatile storage elements at the first speed until the group of non-volatile storage elements pass the first verify level comprises:
   a) applying an erase pulse to a group of non-volatile storage elements;
   b) verifying whether the group of non-volatile storage elements have a threshold voltage below a first voltage level as a result of applying the erase pulse;
   c) increasing a voltage magnitude of the erase pulse by a first amount if the group of non-volatile storage elements do not pass verify at the first voltage level; and d) repeating said a)-c) until the group of non-volatile storage elements pass verify at the first voltage level;
wherein the erasing the group of non-volatile storage elements at the second speed that is less than the first speed until the group of non-volatile storage elements pass the second verify level that is lower than the first verify level comprises:
e) increasing the voltage magnitude of the erase pulse by a second amount in response to the group of non-volatile storage elements passing verify at the first voltage level, the second amount is less than the first amount;
f) applying the erase pulse to the group of non-volatile storage elements after increasing the voltage magnitude of the erase pulse by the second amount;
g) verifying whether the group of non-volatile storage elements have a threshold voltage below a second voltage level as a result of applying the erase pulse, the second level is lower than the first level; and
h) repeating said e)-g) until the group of non-volatile storage elements pass verify at the second voltage level.

19. A non-volatile storage device, comprising:
a three-dimensional memory array comprising a plurality of non-volatile storage elements; and
one or more managing circuits in communication with the plurality of non-volatile storage elements, the one or more managing circuits perform a first phase of an erase operation in which the one or more managing circuits erase a group of the non-volatile storage elements at a first rate until the group of non-volatile storage elements pass a first verify level, the one or more managing circuits perform a second phase of the erase operation after the group of non-volatile storage elements pass the first verify level, in the second phase the one or more managing circuits erase the group of non-volatile storage elements at a second rate that is less than the first rate until the group of non-volatile storage elements pass a second verify level that is lower than the first verify level.

* * * * *

UNITED STATES PATENT AND TRADEMARK OFFICE
CERTIFICATE OF CORRECTION

PATENT NO. : 9,224,494 B2  
APPLICATION NO. : 14/152834  
DATED : December 29, 2015  
INVENTOR(S) : Chin et al.

Page 1 of 1

It is certified that error appears in the above-identified patent and that said Letters Patent is hereby corrected as shown below:

Column 22, line 23, claim 14: After "to" and before "erase", delete "applying" and replace with -- apply --.

Signed and Sealed this  
Twenty-third Day of August, 2016

Michelle K. Lee  
*Director of the United States Patent and Trademark Office*